(12) United States Patent
Brosnihan et al.

(10) Patent No.: US 9,213,181 B2
(45) Date of Patent: Dec. 15, 2015

(54) MEMS ANCHOR AND SPACER STRUCTURE

(75) Inventors: Timothy J. Brosnihan, Natick, MA (US); Mark B. Andersson, Northborough, MA (US); Eugene E. Fike, III, Amesbury, MA (US); Joyce Wu, Somerville, MA (US); J. Lodewyk Steyn, Winchester, MA (US)

(73) Assignee: Pixtronix, Inc., San Diego, CA (US)

( * ) Notice: Subject to any disclaimer, the term of this patent is extended or adjusted under 35 U.S.C. 154(b) by 410 days.

(21) Appl. No.: 13/474,532

(22) Filed: May 17, 2012

(65) Prior Publication Data
US 2012/0295058 A1   Nov. 22, 2012

Related U.S. Application Data

(60) Provisional application No. 61/488,574, filed on May 20, 2011.

(51) Int. Cl.
*G02B 26/00* (2006.01)
*G02B 26/02* (2006.01)
(Continued)

(52) U.S. Cl.
CPC .............. *G02B 26/02* (2013.01); *B81B 7/0067* (2013.01); *B81C 1/00* (2013.01); *B81C 1/00039* (2013.01); *B81C 1/00261* (2013.01); *G09G 3/3433* (2013.01); *H01L 23/544* (2013.01); *H01L 24/83* (2013.01); *H01L 24/97* (2013.01); *B81B 2201/038* (2013.01); *B81B 2201/047* (2013.01); *B81C 2203/054* (2013.01); *G09G 3/3413* (2013.01); *G09G 3/3466* (2013.01); *G09G 2320/041* (2013.01); *G09G 2360/144* (2013.01); *H01L 24/11* (2013.01); *H01L 24/13* (2013.01);

(Continued)

(58) Field of Classification Search
CPC ....... G02B 26/00; G02B 26/02; G02B 26/023
See application file for complete search history.

(56) References Cited

U.S. PATENT DOCUMENTS 6,741,377 B2    5/2004  Miles
2002/0132389 A1*  9/2002  Patel et al. .................. 438/97
(Continued)

FOREIGN PATENT DOCUMENTS

WO    2004006003 A1    1/2004
WO    2006091860 A2    8/2006

OTHER PUBLICATIONS

Partial International Search Report—PCT/US2012/038611—ISA/EPO—Jul. 31, 2012.
(Continued)

*Primary Examiner* — Joseph P Martinez
(74) *Attorney, Agent, or Firm* — Edward A. Gordon; Foley & Lardner LLP

(57) ABSTRACT

A display apparatus includes a first substrate, a plurality of microelectromechanical systems (MEMS) light modulators formed from a structural material coupled to the first substrate and a second substrate separated from the first substrate. A plurality of spacers extend from the first substrate to keep the second substrate a minimum distance away from the plurality of light modulators. The spacers include a first polymer layer having a surface in contact with the first substrate, a second polymer layer encapsulating the first polymer layer and a layer of the structural material encapsulating the second polymer layer. The spacers can be used as fluid barriers and configured to surround more than one but less than all of the MEMS light modulators in the display apparatus.

50 Claims, 22 Drawing Sheets

(51) Int. Cl.
    *G09G 3/34*      (2006.01)
    *H01L 23/544*    (2006.01)
    *B81C 1/00*      (2006.01)
    *B81B 7/00*      (2006.01)
    *H01L 23/00*     (2006.01)

(52) U.S. Cl.
    CPC ............... *H01L 24/16* (2013.01); *H01L 24/32* (2013.01); *H01L 24/73* (2013.01); *H01L 24/81* (2013.01); *H01L 2223/54426* (2013.01); *H01L 2224/114* (2013.01); *H01L 2224/1132* (2013.01); *H01L 2224/11462* (2013.01); *H01L 2224/131* (2013.01); *H01L 2224/16238* (2013.01); *H01L 2224/2612* (2013.01); *H01L 2224/29011* (2013.01); *H01L 2224/32238* (2013.01); *H01L 2224/73201* (2013.01); *H01L 2224/81121* (2013.01); *H01L 2224/81192* (2013.01); *H01L 2224/81815* (2013.01); *H01L 2224/83007* (2013.01); *H01L 2224/83121* (2013.01); *H01L 2924/01029* (2013.01); *H01L 2924/12041* (2013.01); *H01L 2924/1461* (2013.01); *H01L 2924/15788* (2013.01); *Y10T 428/24157* (2015.01); *Y10T 428/24744* (2015.01)

(56) References Cited

U.S. PATENT DOCUMENTS

| | | |
|---|---|---|
| 2006/0250325 A1 | 11/2006 | Hagood et al. |
| 2007/0216987 A1 | 9/2007 | Hagood et al. |
| 2008/0164592 A1 | 7/2008 | Bakke et al. |
| 2008/0278798 A1 | 11/2008 | Hagood et al. |
| 2009/0195855 A1* | 8/2009 | Steyn et al. .............. 359/290 |
| 2009/0244678 A1 | 10/2009 | Hagood, IV et al. |

OTHER PUBLICATIONS

International Search Report and Written Opinion—PCT/US2012/038611—ISA/EPO—Nov. 7, 2012.
Taiwan Search Report—TW101117915—TIPO—Dec. 26, 2014.

* cited by examiner

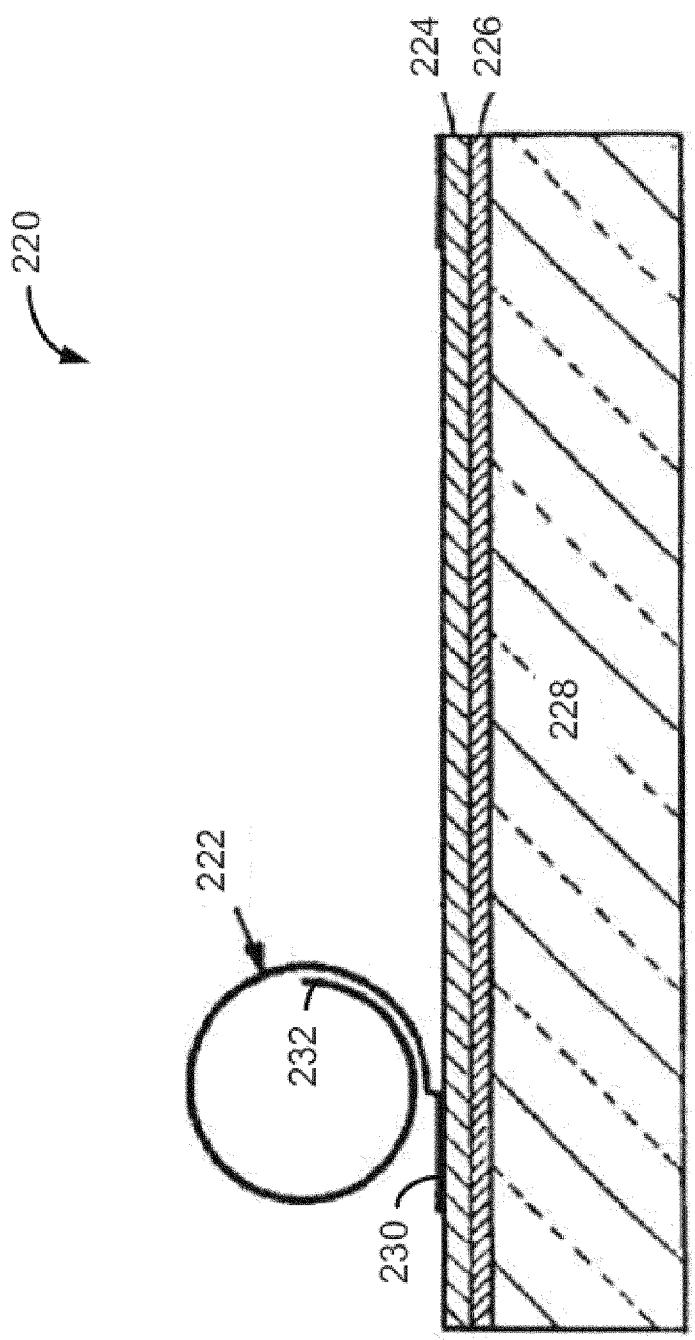

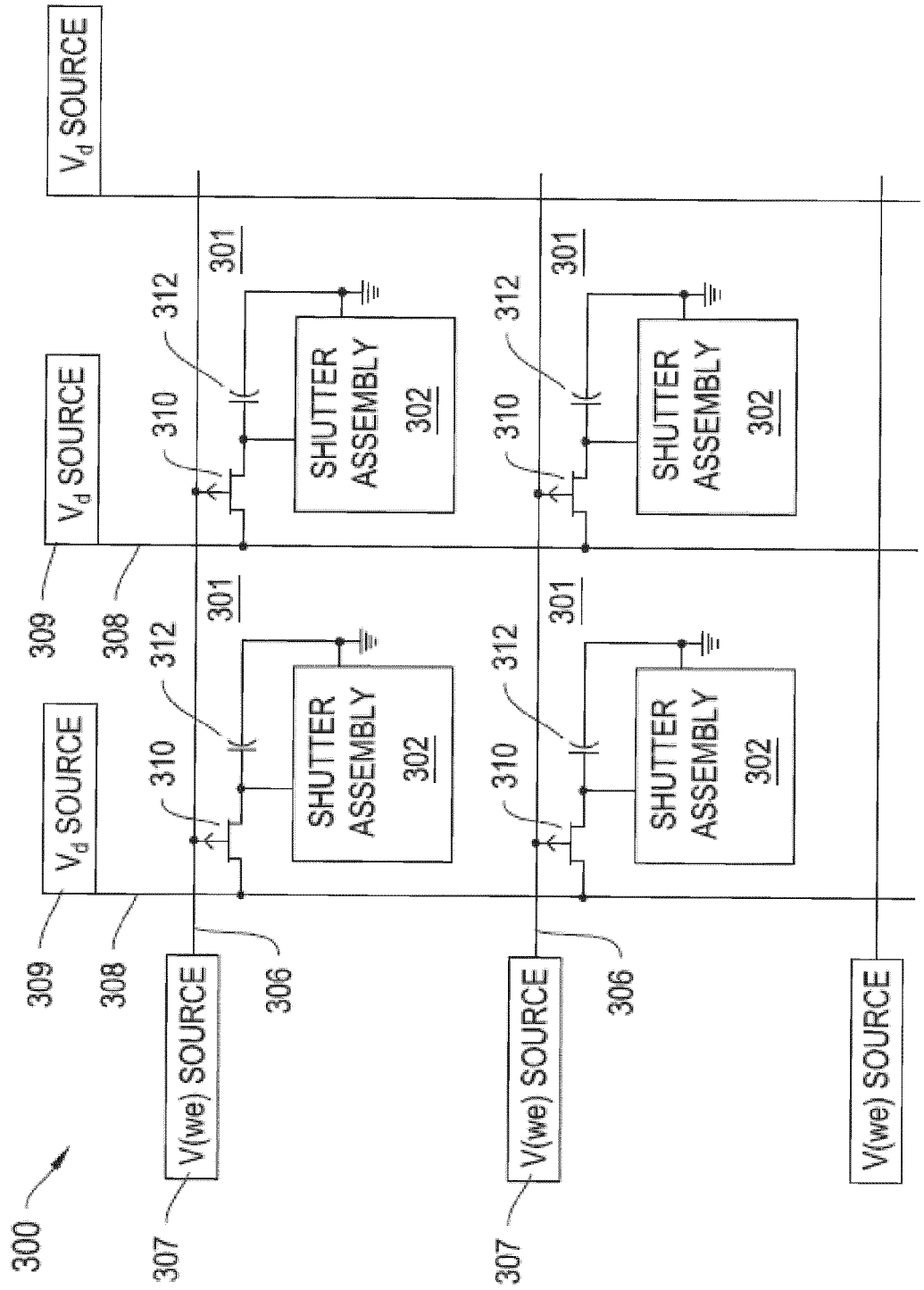

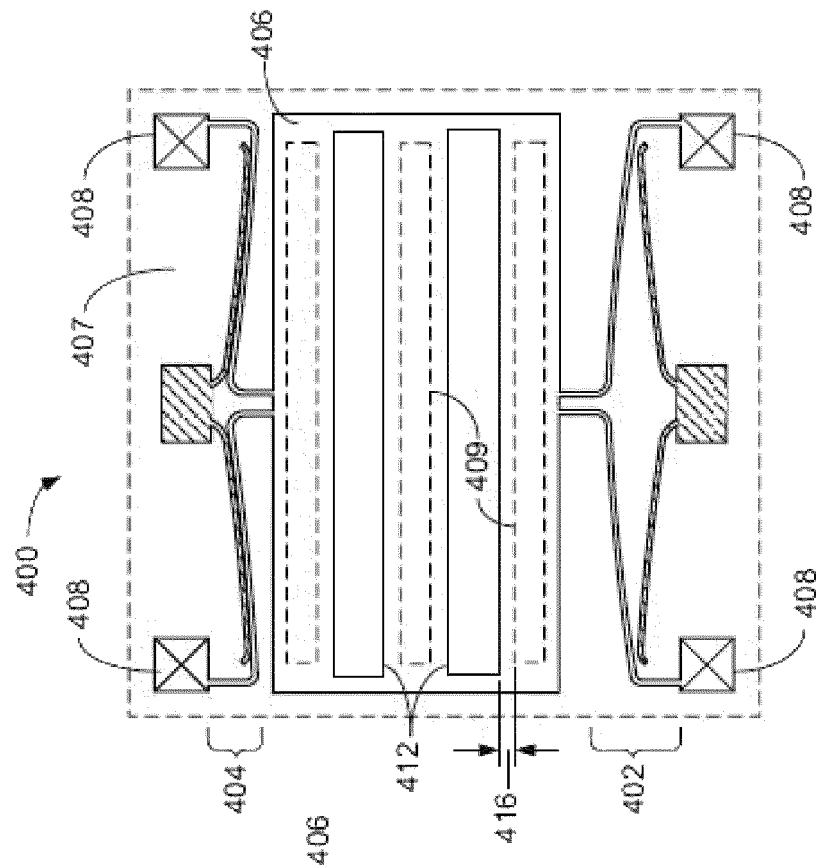
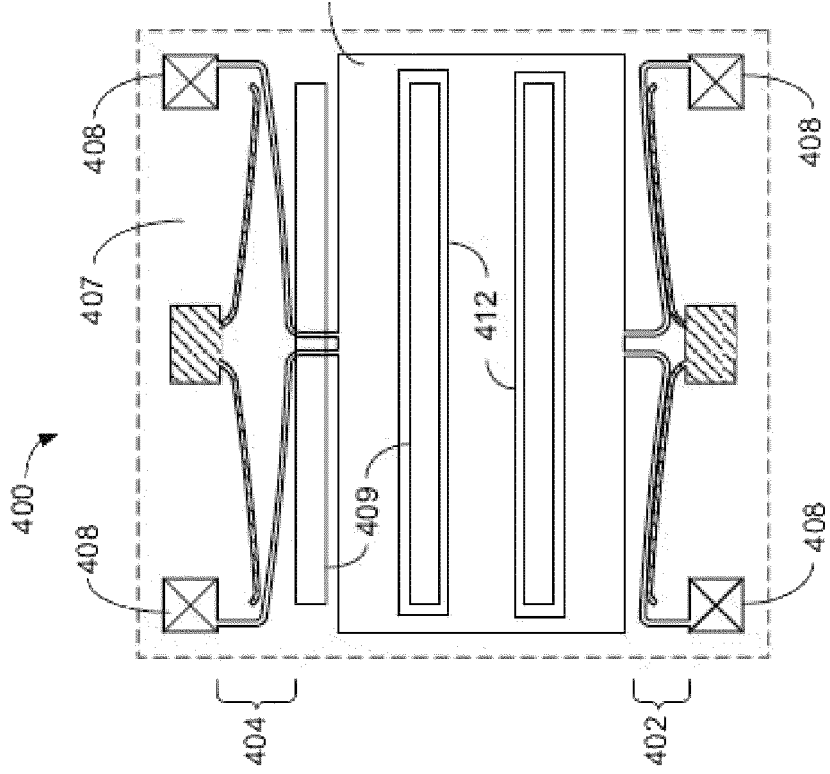

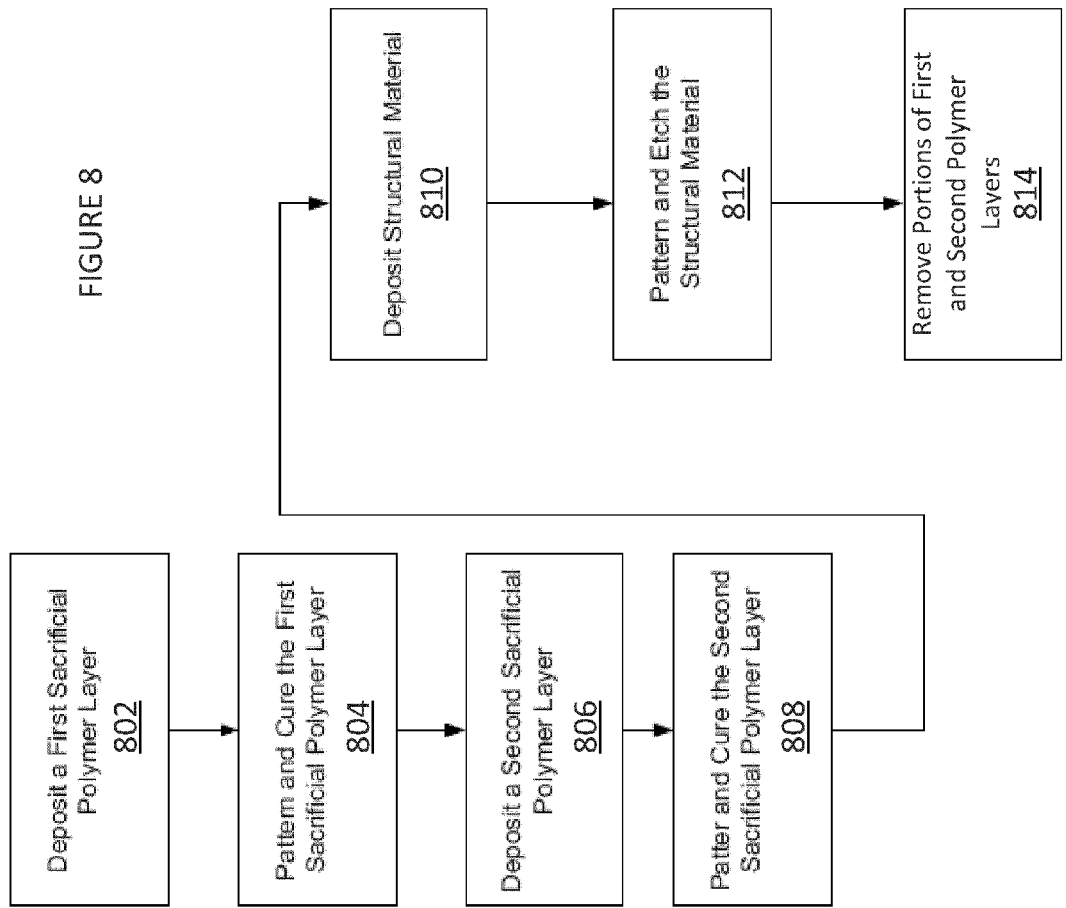

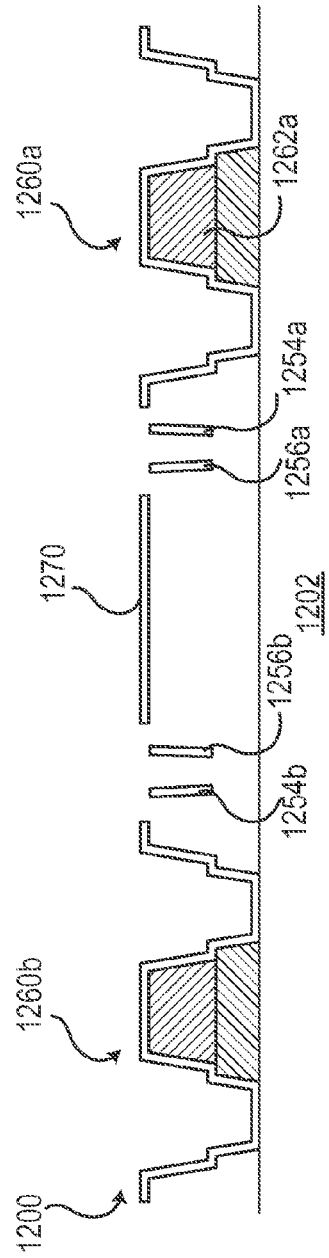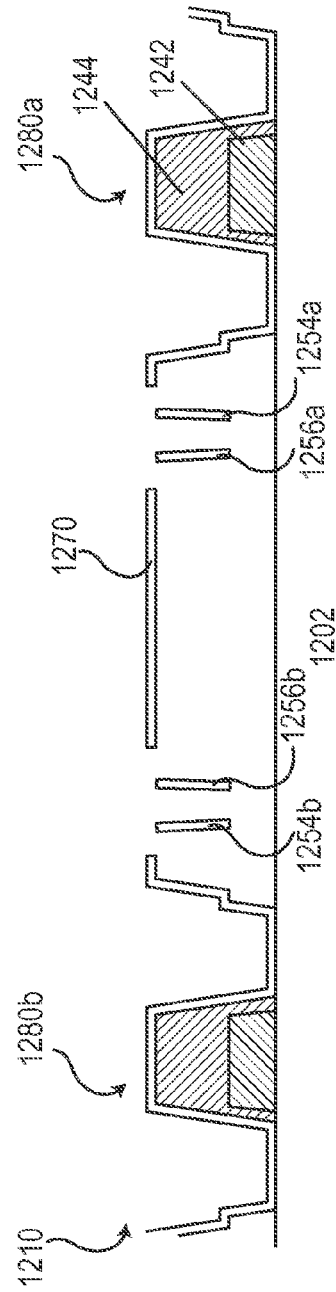

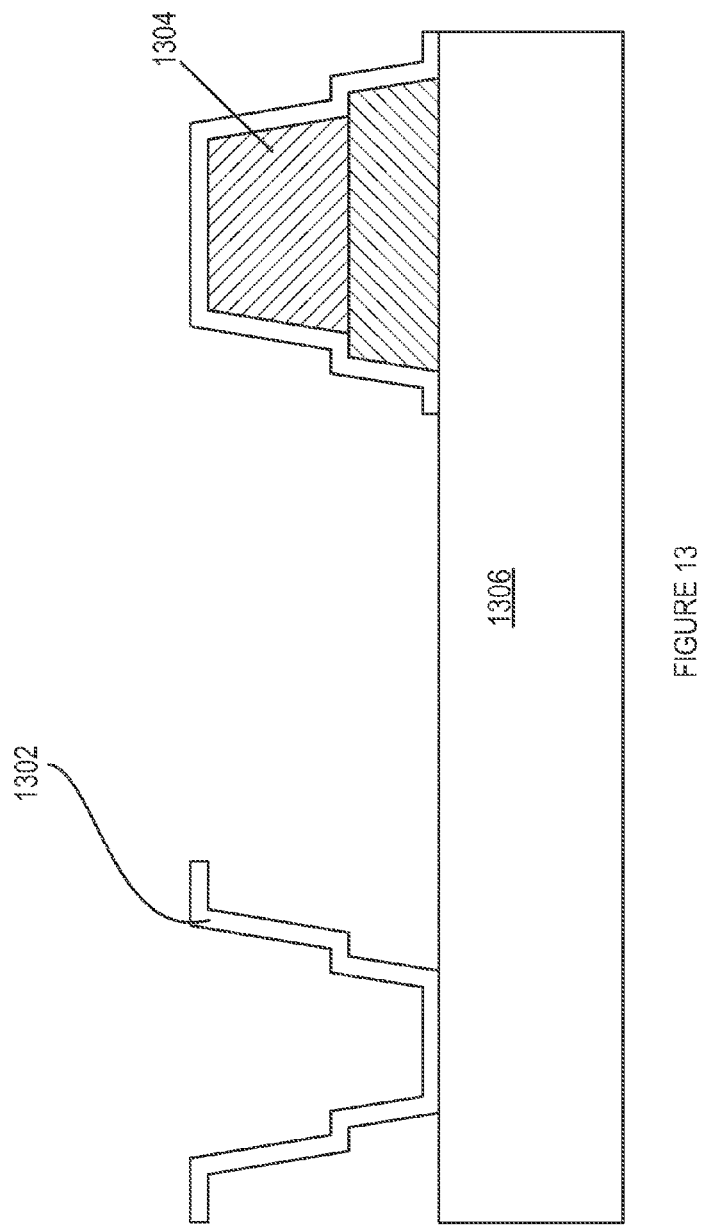

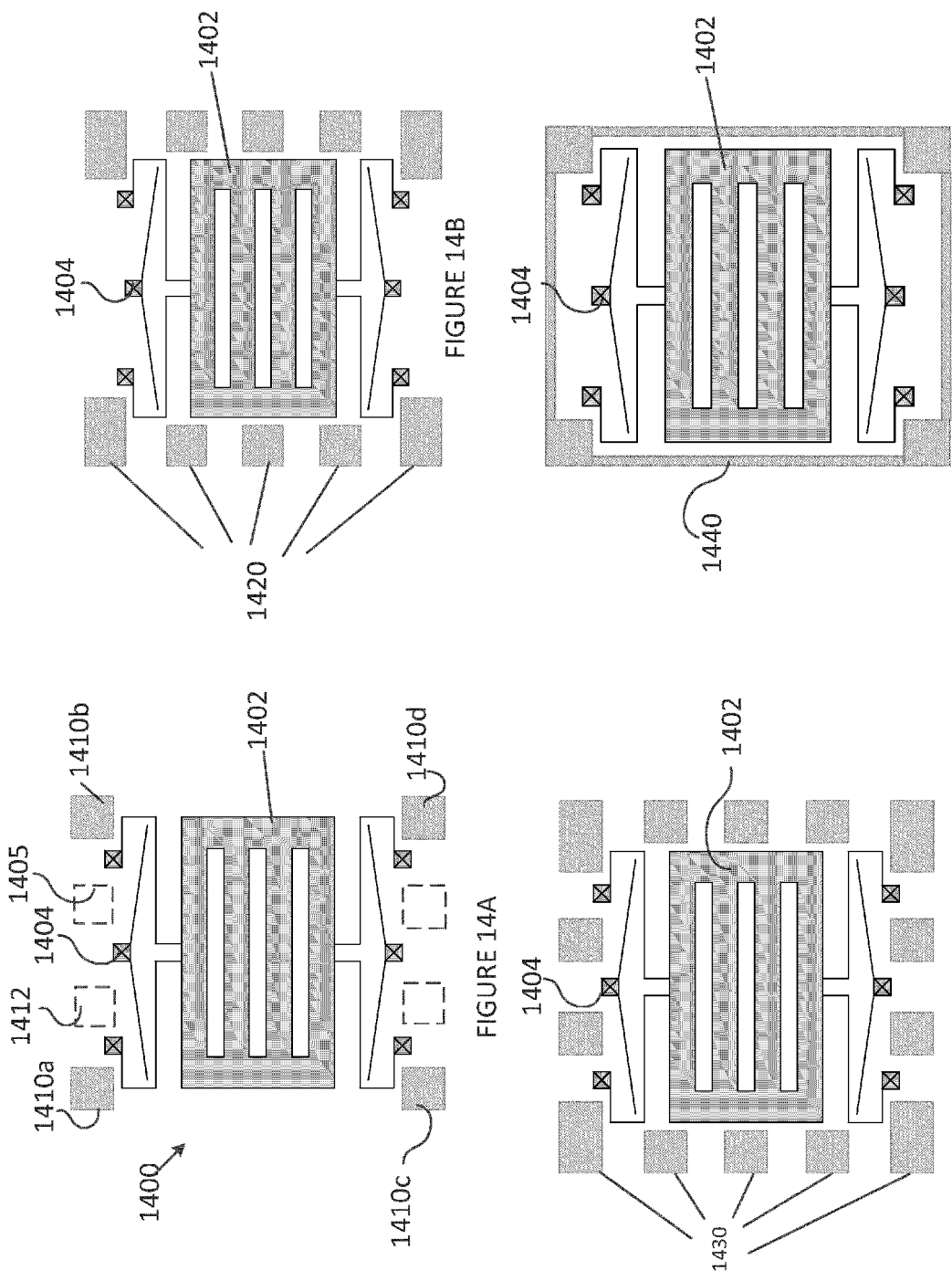

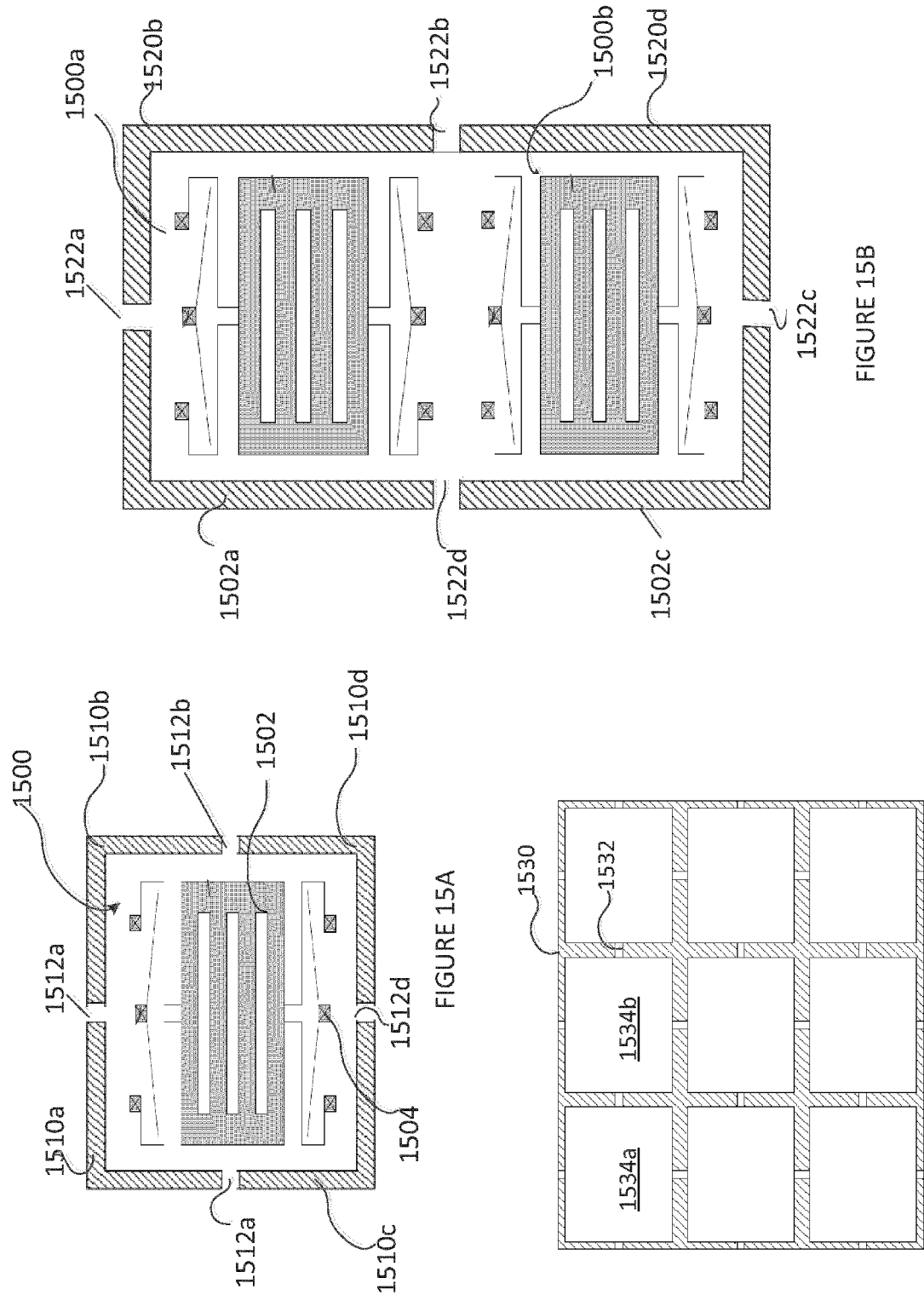

MEMS ANCHOR AND SPACER STRUCTURE

CROSS-REFERENCE TO RELATED APPLICATIONS

This patent application claims priority to U.S. Provisional Patent Application No. 61/488,574, filed on May 20, 2011, entitled "Apparatus and Methods For MEMS-Integrated Spacers." The disclosure of the prior application is considered part of and is incorporated by reference in this patent application.

TECHNICAL FIELD

This disclosure relates to the field of displays. In particular, this disclosure relates to fabrication and use of a microelectromechanical systems (MEMS) anchor and spacer structure.

DESCRIPTION OF THE RELATED TECHNOLOGY

Display devices that incorporate mechanical light modulators can include hundreds, thousands, or in some cases, millions of moving elements. In some devices, every movement of an element provides an opportunity for static friction to disable one or more of the elements. This movement can be facilitated by immersing all the element parts in a fluid and sealing the fluid within a fluid space or gap between two substrates in a MEMS display cell. Spacers can be used to maintain the gap between the two substrates, such as a light modulator substrate and a cover plate, of the display device. In some implementations, spacers are expensive to fabricate because they require a separate fabrication process.

SUMMARY

The systems, methods and devices of the disclosure each have several innovative aspects, no single one of which is solely responsible for the desirable attributes disclosed herein.

One innovative aspect of the subject matter described in this disclosure can be implemented in a display apparatus having a first substrate, a plurality of MEMS light modulators formed from a structural material coupled to the first substrate and a second substrate separated from the first substrate. A plurality of spacers extend from the first substrate. The spacers include a first polymer layer having a surface in contact with the first substrate, a second polymer layer encapsulating the first polymer layer and a layer of the structural material encapsulating the second polymer layer. In some implementations, the plurality of spacers are sized to keep the second substrate a minimum distance away from the plurality of light modulators. In some implementations, the second polymer layer encapsulates the first polymer layer by covering all surfaces of the first polymer layer not substantially in contact with the first substrate. In some implementations, the layer of the structural material encapsulates the second polymer layer by covering all surfaces of the second polymer layer not substantially in contact with an exterior surface of the first polymer layer or the substrate. In some implementations, at least one of the first polymer layer and the second polymer layer includes a resist layer. In some implementations, the layer of the light absorbing structural material includes a semiconductor layer and a metal layer. In some implementations, the layer of the structural material includes at least one of silicon (Si), titanium (Ti), aluminum (Al), aluminum oxide ($Al_2O_3$) silicon nitride (SiN) and an oxynitride (OxNy). In some implementations, the structural material includes a light absorbing material that absorbs at least about 80% of light impinging on the light absorbing material. In some implementations, the layer of structural material is a plasma enhanced chemical vapor deposition (PECVD)-deposited layer.

Another innovative aspect of the subject matter described in this disclosure can be implemented in an apparatus having a first substrate, at least one MEMS device coupled to the first substrate and a second substrate separated from the first substrate. A plurality of spacers extend from the first substrate. The spacers include a first polymer layer, a second polymer layer, and a PECVD-deposited layer of the structural material which substantially encapsulates the first and second polymer layers. In some implementations, the plurality of spacers are sized to keep the second substrate a minimum distance away from the MEMS device. In some implementations, the second polymer layer encapsulates the first polymer layer by covering all surfaces of the first polymer layer not substantially in contact with the first substrate. In some other implementations, the layer of the structural material encapsulates the second polymer layer by covering all surfaces of the second polymer layer not substantially in contact with an exterior surface of the first polymer layer or the substrate. In some implementations, at least one of the first polymer layer and the second polymer layer includes a resist layer. In some implementations, the layer of the light absorbing structural material includes a semiconductor layer and a metal layer. In some implementations, the layer of the structural material includes at least one of Si, Ti, SiN and an OxNy. In some implementations, the structural material may be a light absorbing material that absorbs at least about 80% of light impinging on the light absorbing material.

Another innovative aspect of the subject matter described in this disclosure can be implemented in an apparatus having a first substrate, at least one MEMS device formed from a light absorbing structural material and supported by the first substrate. A second substrate is separated from the first substrate. A plurality of spacers extend from the first substrate. The spacers include a first polymer layer having a surface in contact with the first substrate and a second polymer layer having a surface in contact with the first polymer layer. The spacers also include a layer of the light absorbing structural material which substantially encapsulates the first and second polymer layers and absorbs at least about 80% of light impinging on the layer of the light absorbing structural material. In some implementations, at least one of the first polymer layer and the second polymer layer includes a resist layer. In some implementations, the plurality of spacers are sized to keep the second substrate a minimum distance away from the MEMS device. In some implementations, the layer of the light absorbing structural material includes a semiconductor layer and a metal layer. In some implementations, the layer of the light absorbing structural material includes at least one of Si, Ti, SiN and an OxNy. In some implementations, the layer of the light absorbing structural material is a PECVD-deposited layer.

Another innovative aspect of the subject matter described in this disclosure can be implemented in an apparatus having a first substrate, at least one MEMS device supported by the first substrate and a second substrate separated from the first substrate. A plurality of spacers extend from the first substrate. The spacers include a first polymer layer having a surface in contact with the first substrate and a second polymer layer having a surface in contact with the first polymer layer. The spacers also include a PECVD-deposited layer that encapsulates the first and second polymer layers. In some implementations, the plurality of spacers are sized to keep the second substrate a minimum distance away from the MEMS device. In some implementations, the second polymer layer encapsulates the first polymer layer by covering all surfaces of the first polymer layer not substantially in contact with the first substrate. In some implementations, at least one of the first polymer layer and the second polymer layer includes a resist layer. In some implementations, the layer of the structural material includes a semiconductor layer and a metal layer. In some implementations, the layer of the structural material includes at least one of Si, Ti, SiN and an OxNy. In some implementations, the structural material includes a light absorbing material that absorbs at least about 80% of light impinging on the light absorbing structural material.

Another innovative aspect of the subject matter described in this disclosure can be implemented in a display apparatus having a first substrate, a plurality of MEMS light modulators formed from a structural material coupled to the first substrate and a second substrate separated from the first substrate. The display apparatus includes at least one anchor for suspending at least one of the plurality of MEMS light modulators over the first substrate. The anchor includes a first polymer layer having a surface in contact with the first substrate, a second polymer layer having a surface in contact with the first polymer layer and a layer of the structural material encapsulating the first and second polymer layers. In some implementations, the second polymer layer encapsulates the first polymer layer by covering all surfaces of the first polymer layer not substantially in contact with the first substrate. In some implementations, at least one of the first polymer layer and the second polymer layer includes a resist layer. In some implementations, the layer of the structural material includes a semiconductor layer and a metal layer. In some implementations, the layer of the structural material includes at least one of Si, Ti, SiN and an OxNy. In some implementations, the structural material includes a light absorbing material that absorbs at least about 80% of light impinging on the light absorbing material. In some implementations, the layer of structural material is a PECVD-deposited layer.

Another innovative aspect of the subject matter described in this disclosure can be implemented in a display apparatus having a first substrate, a plurality of MEMS light modulators formed from a structural material coupled to the first substrate and a second substrate separated from the first substrate. The display apparatus includes a fluid barrier substantially enclosing more than one but less than all of the MEMS light modulators. The fluid barrier extends from the first substrate and is configured for interfering with a flow of fluid across the display towards the enclosed MEMS light modulators. In some implementations, the fluid barrier has a height over the first substrate substantially equivalent to a height of the plurality of MEMS light modulators over the first substrate. In some implementations, the fluid barrier includes a plurality of discontinuous barrier structures separated by openings. In some implementations, at least one of the plurality of discontinuous barrier structures includes a first polymer layer having a surface in contact with the first substrate, a second polymer layer having a surface in contact with the first polymer layer and a layer of the structural material encapsulating the first and second polymer layers.

Another innovative aspect of the subject matter described in this disclosure can be implemented in an apparatus having a first substrate, a plurality of MEMS devices formed from a structural material coupled to the first substrate and a second substrate separated from the first substrate. The apparatus includes a fluid barrier including a plurality of spacers. The spacers includes a first polymer layer, a second polymer layer and a layer of the structural material. The first polymer layer is encapsulated by the first substrate and the layer of the structural material. In some implementations, the plurality of spacers form a substantially contiguous barrier around at least one MEMS device. In some implementations, the spacers substantially enclose more than one but less than all of the MEMS devices.

Another innovative aspect of the subject matter described in this disclosure can be implemented in an apparatus having a first substrate, a plurality of MEMS devices supported by the first substrate and a second substrate separated from the first substrate. The apparatus includes a fluid barrier including a plurality of spacers that substantially enclose more than one but less than all of the MEMS devices. In some implementations, the plurality of spacers form a substantially contiguous barrier around at least one MEMS device. In some implementations, the MEMS device is formed from a structural material and the spacers includes a first polymer layer, a second polymer layer and a layer of the structural material.

Another innovative aspect of the subject matter described in this disclosure can be implemented in a method for manufacturing a display assembly including forming an anchor and a spacer that includes a first polymer layer and a second polymer layer encapsulated by a layer of structural material, wherein forming the anchor and the spacer. The process of forming the anchor and the spacer includes depositing the first polymer layer on the first transparent substrate and then patterning and curing the first polymer layer. After patterning and curing the first polymer layer, the second polymer layer is deposited on the first transparent substrate and on top of the remainder of the first polymer layer. The second polymer layer is then patterned and cured. A layer of structural material is then deposited over the first polymer layer and the second polymer layer using PECVD. The layer of structural material is then patterned and cured to form the anchor and the spacer. Remaining portions of the first and second polymer layers are then removed to release the anchor and the spacer such that the spacer includes the first polymer layer and the second polymer layer substantially encapsulated by the layer of structural material. In some implementations, at least one of the first polymer layer and the second polymer layer includes a resist. In some implementations, the layer of structural material comprises a light absorbing material absorbs at least about 80% of light impinging on the layer of structural material. In some implementations, the second polymer layer can be deposited on the first transparent substrate on top of the remainder of the first polymer layer such that portions of the cured first polymer layer are encapsulated by the remaining portions of the second polymer layer.

Details of one or more implementations of the subject matter described in this specification are set forth in the accompanying drawings and the description below. Although the examples provided in this summary are primarily described in terms of MEMS-based displays, the concepts provided herein may apply to other types of displays, such as LCD, OLED, electrophoretic, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIG. 2B shows a cross sectional view of a rolling actuator shutter-based light modulator.

FIG. 3A shows an example schematic diagram of a control matrix.

FIGS. 4A and 4B show example views of a dual actuator shutter assembly.

FIG. 8 shows a flow diagram of a fabrication process for simultaneously fabricating spacers and anchors on a substrate for use in a display apparatus.

FIGS. 12A and 12B show example cross sectional views of two anchor and shutter assemblies formed along with corresponding portions of a MEMS device.

FIG. 13 shows an example cross sectional view of an anchor and separate spacer formed on a substrate by a single fabrication process.

FIGS. 14A-14D show example fluid barrier configurations for use in display apparatus.

FIG. 15A-15C show additional example fluid barrier configurations for use in display apparatus.

DETAILED DESCRIPTION

This disclosure relates to the fabrication of MEMS anchor and spacer structures for use in display apparatus. In particular, MEMS anchor and spacer structures can be fabricated on a light modulation substrate of a display apparatus by employing a single fabrication process. In some implementations, an integrated MEMS anchor and spacer structure can include a first polymer layer and a second polymer layer encapsulated by a layer of structural material. The layer of structural material may be light absorbing and may be deposited by using a plasma enhanced chemical vapor deposition (PECVD) technique. In some implementations, the second polymer layer may encapsulate the first polymer layer, which in turn will be encapsulated by the layer of structural material. Further, the anchor and spacer structures may be formed as an integrated MEMS anchor and spacer structure. In these implementations, portions of the anchor also server as a spacer. In some implementations, the spacers may serve as fluid barriers. In some implementations, the fluid barriers completely or substantially enclose one or more, but less than all, of the MEMS devices. In applications that correspond to display apparatus, the MEMS devices can be MEMS light modulators.

Particular implementations of the subject matter described in this disclosure can be implemented to realize one or more of the following potential advantages. The fabrication process disclosed herein allows for the simultaneous formation of anchors and spacers. The process reduces the cost and complexity of fabricating MEMS displays, in which spacers are typically fabricated or added with a separate, additional process. In addition to achieving cost reductions by using only a single fabrication process, employing a single fabrication process results in the fabrication of anchors that are sufficiently resilient that they also may serve as spacers. Moreover, the use of the spacers as fluid barriers in display apparatus that include a fluid surrounding mechanical light modulators helps prevent damage to the light modulators that might be caused by pressure waves being propagated through the fluid across the display apparatus resulting from impacts on the display.

Figure 1A:
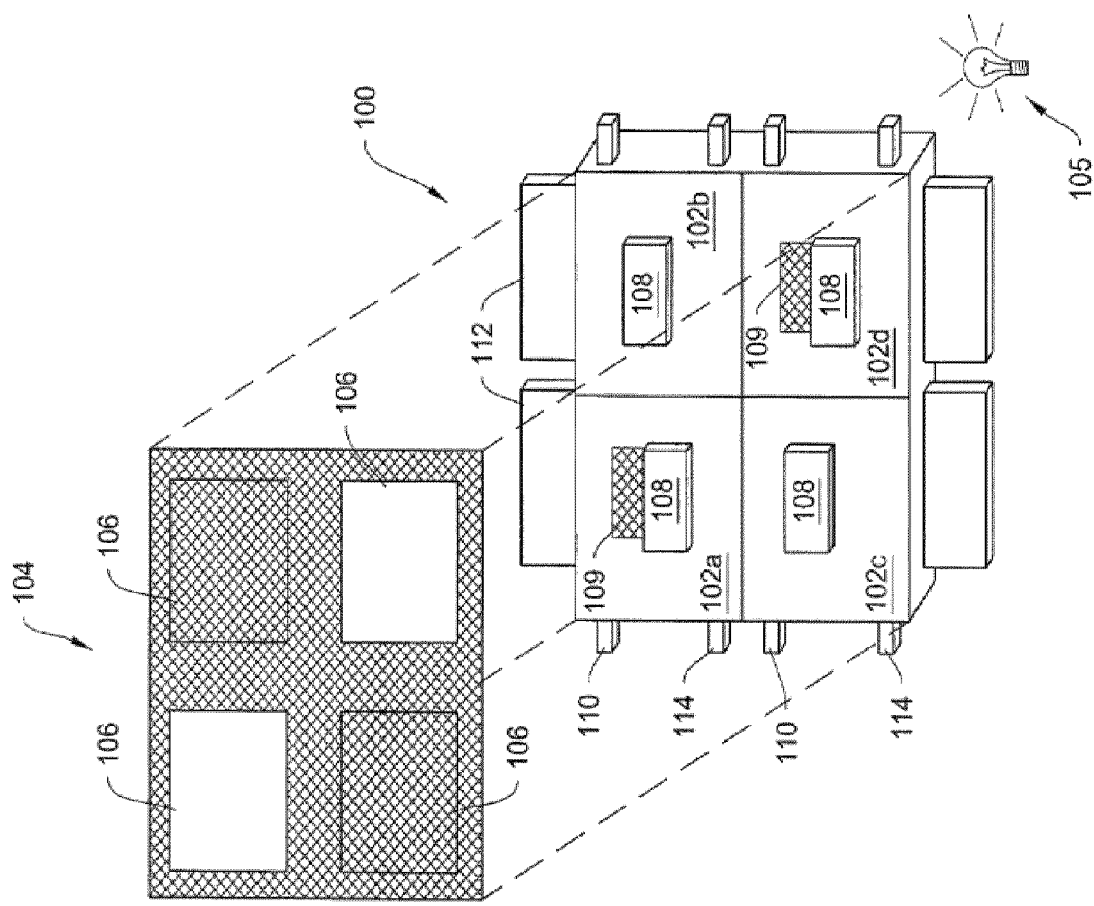
FIG. 1A shows an example schematic diagram of a direct-view MEMS-based display apparatus.

FIG. 1A shows a schematic diagram of a direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (e.g., interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, $V_{WE}$"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
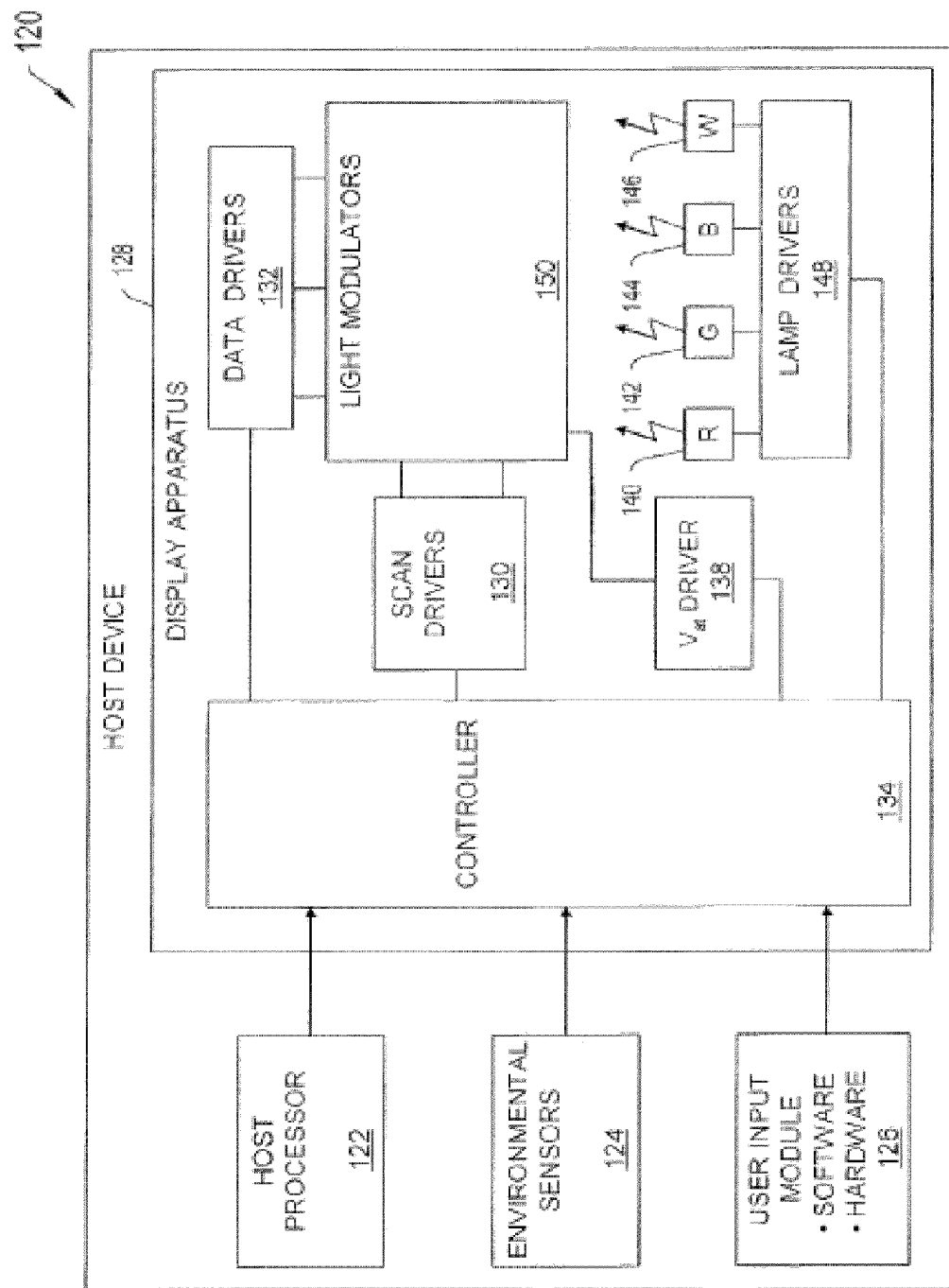
FIG. 1B shows an example block diagram of a host device.

FIG. 1B shows an example of a block diagram 120 of a host device (i.e., cell phone, smart phone, PDA, MP3 player, tablet, e-reader, etc.). The host device includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, and lamp drivers 148. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the light modulators, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in predetermined sequences grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all light modulators within the array of light modulators, for instance by supplying voltage to a series of common interconnects 114. In some other implementations, the common drivers 138, following commands from the controller 134, issue voltage pulses or signals to the array of light modulators, for instance global actuation pulses which are capable of driving and/or initiating simultaneous actuation of all light modulators in multiple rows and columns of the array.

All of the drivers (e.g., scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array of pixels, the output of voltages from the data drivers 132, and the output of voltages that provide for light modulator actuation.

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the modulator array by a sequential addressing of individual rows, also referred to as scan lines. For each row or scan line in the sequence, the scan driver 130 applies a write-enable voltage to the write enable interconnect 110 for that row of the array, and subsequently the data driver 132 supplies data voltages, corresponding to desired shutter states, for each column in the selected row. This process repeats until data has been loaded for all rows in the array. In some implementations, the sequence of selected rows for data loading is linear, proceeding from top to bottom in the array. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array, for instance by addressing only every $5^{th}$ row of the array in sequence.

In some implementations, the process for loading image data to the array is separated in time from the process of actuating the shutters 108. In these implementations, the modulator array may include data memory elements for each pixel in the array and the control matrix may include a global actuation interconnect for carrying trigger signals, from common driver 138, to initiate simultaneous actuation of shutters 108 according to data stored in the memory elements.

In alternative implementations, the array of pixels and the control matrix that controls the pixels may be arranged in configurations other than rectangular rows and columns. For example, the pixels can be arranged in hexagonal arrays or curvilinear rows and columns. In general, as used herein, the term scan-line shall refer to any plurality of pixels that share a write-enabling interconnect.

The host processor 122 generally controls the operations of the host. For example, the host processor may be a general or special purpose processor for controlling a portable electronic device. With respect to the display apparatus 128, included within the host device 120, the host processor outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device. The environmental sensor module receives data about the ambient environment, such as temperature and or ambient lighting conditions. The sensor module 124 can be programmed to distinguish whether the device is operating in an indoor or office environment versus an outdoor environment in bright daylight versus and outdoor environment at nighttime. The sensor module communicates this information to the display controller 134, so that the controller can optimize the viewing conditions in response to the ambient environment.

Figure 2A:
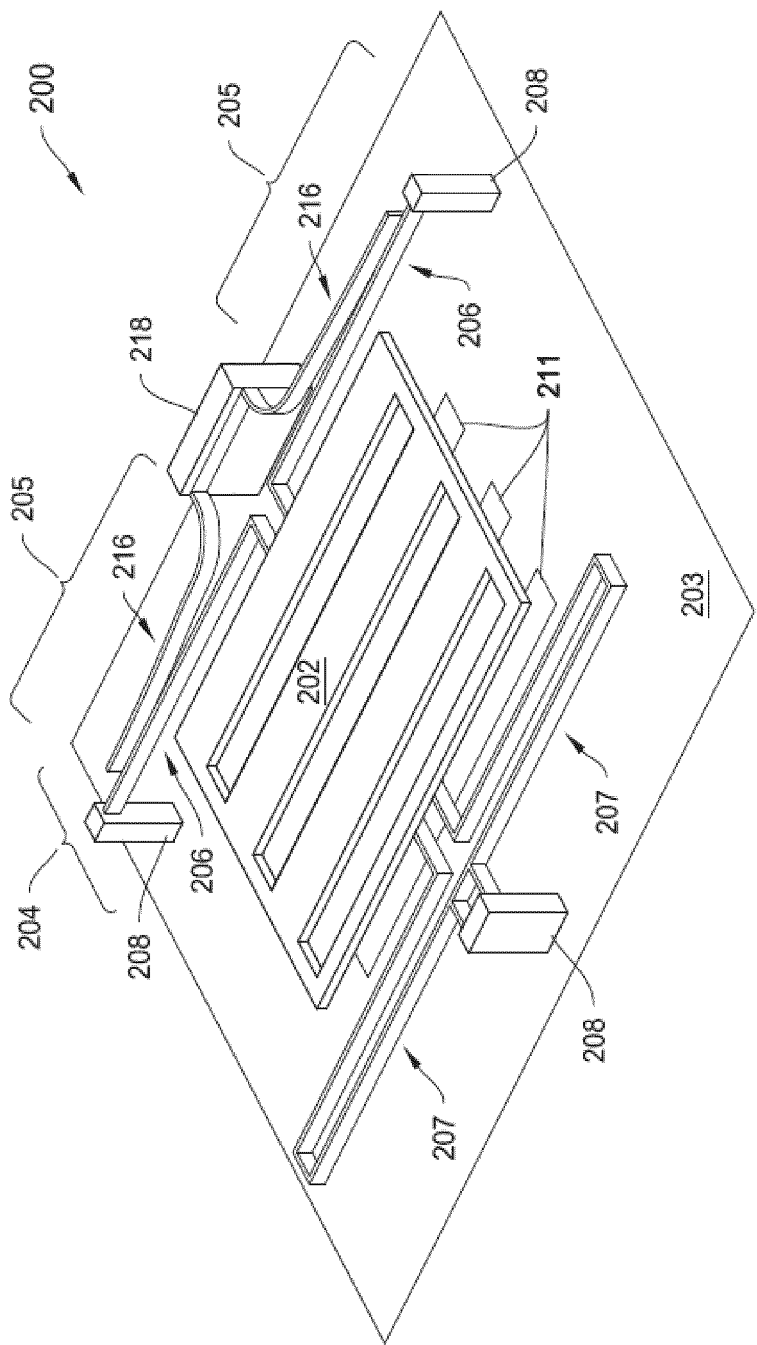
FIG. 2A shows an example perspective view of an illustrative shutter-based light modulator.

FIG. 2A shows a perspective view of an illustrative shutter-based light modulator 200. The shutter-based light modulator is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate 204. If the substrate 204 is transparent, such as glass or plastic, then the aperture holes 211 are formed in a layer of light-blocking material deposited on the substrate 203. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely towards the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as light modulator 200, incorporates a passive restoring force, such as a spring, for returning a shutter to its rest position after voltages have been removed. Other shutter assemblies can incorporate a dual set of "open" and "closed" actuators and a separate sets of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases it is appropriate to include switching and/or data storage elements within each pixel of the array (the so-called active matrix) to improve the speed, the luminance level and/or the power dissipation performance of the display.

The display apparatus 100, in alternative implementations, includes light modulators other than transverse shutter-based light modulators, such as the shutter assembly 200 described above. For example, FIG. 2B shows a cross sectional view of a rolling actuator shutter-based light modulator 220. The rolling actuator shutter-based light modulator 220 is suitable for incorporation into an alternative implementation of the MEMS-based display apparatus 100 of FIG. 1A. A rolling actuator-based light modulator includes a movable electrode disposed opposite a fixed electrode and biased to move in a particular direction to function as a shutter upon application of an electric field. In some implementations, the light modulator 220 includes a planar electrode 226 disposed between a substrate 228 and an insulating layer 224 and a movable electrode 222 having a fixed end 230 attached to the insulating layer 224. In the absence of any applied voltage, a movable end 232 of the movable electrode 222 is free to roll towards the fixed end 230 to produce a rolled state. Application of a voltage between the electrodes 222 and 226 causes the movable electrode 222 to unroll and lie flat against the insulating layer 224, whereby it acts as a shutter that blocks light traveling through the substrate 228. The movable electrode 222 returns to the rolled state by means of an elastic restoring force after the voltage is removed. The bias towards a rolled state may be achieved by manufacturing the movable electrode 222 to include an anisotropic stress state.

Figure 2C:
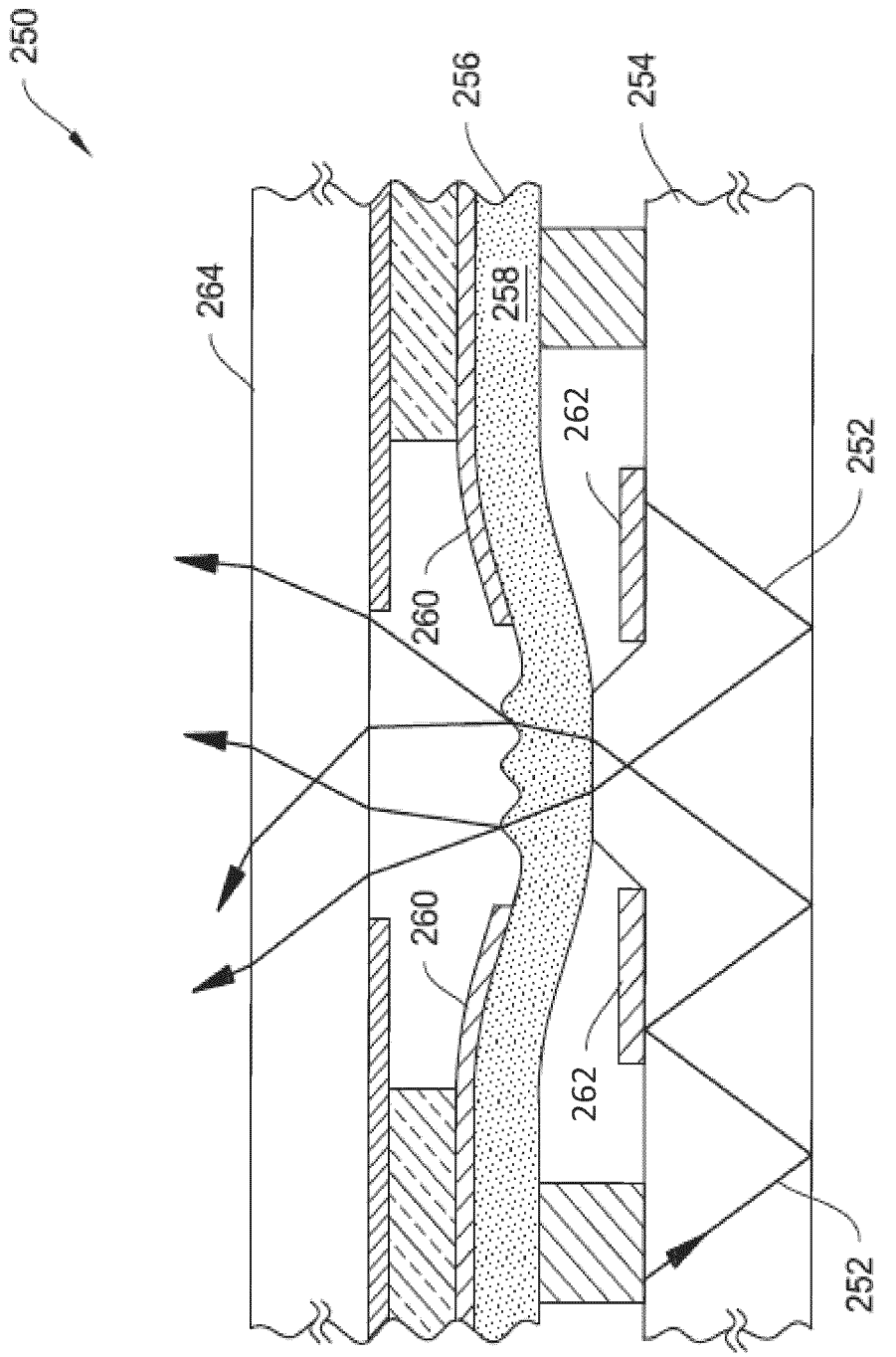
FIG. 2C shows a cross sectional view of an illustrative non shutter-based MEMS light modulator.

FIG. 2C shows a cross sectional view of an illustrative non shutter-based MEMS light modulator 250. The light tap modulator 250 is suitable for incorporation into an alternative implementation of the MEMS-based display apparatus 100 of FIG. 1A. A light tap works according to a principle of frustrated total internal reflection (TIR). That is, light 252 is introduced into a light guide 254, in which, without interference, light 252 is, for the most part, unable to escape the light guide 254 through its front or rear surfaces due to TIR. The light tap 250 includes a tap element 256 that has a sufficiently high index of refraction that, in response to the tap element 256 contacting the light guide 254, the light 252 impinging on the surface of the light guide 254 adjacent the tap element 256 escapes the light guide 254 through the tap element 256 towards a viewer, thereby contributing to the formation of an image.

In some implementations, the tap element 256 is formed as part of a beam 258 of flexible, transparent material. Electrodes 260 coat portions of one side of the beam 258. Opposing electrodes 262 are disposed on the light guide 254. By applying a voltage across the electrodes 260 and 262, the position of the tap element 256 relative to the light guide 254 can be controlled to selectively extract light 252 from the light guide 254.

Figure 2D:
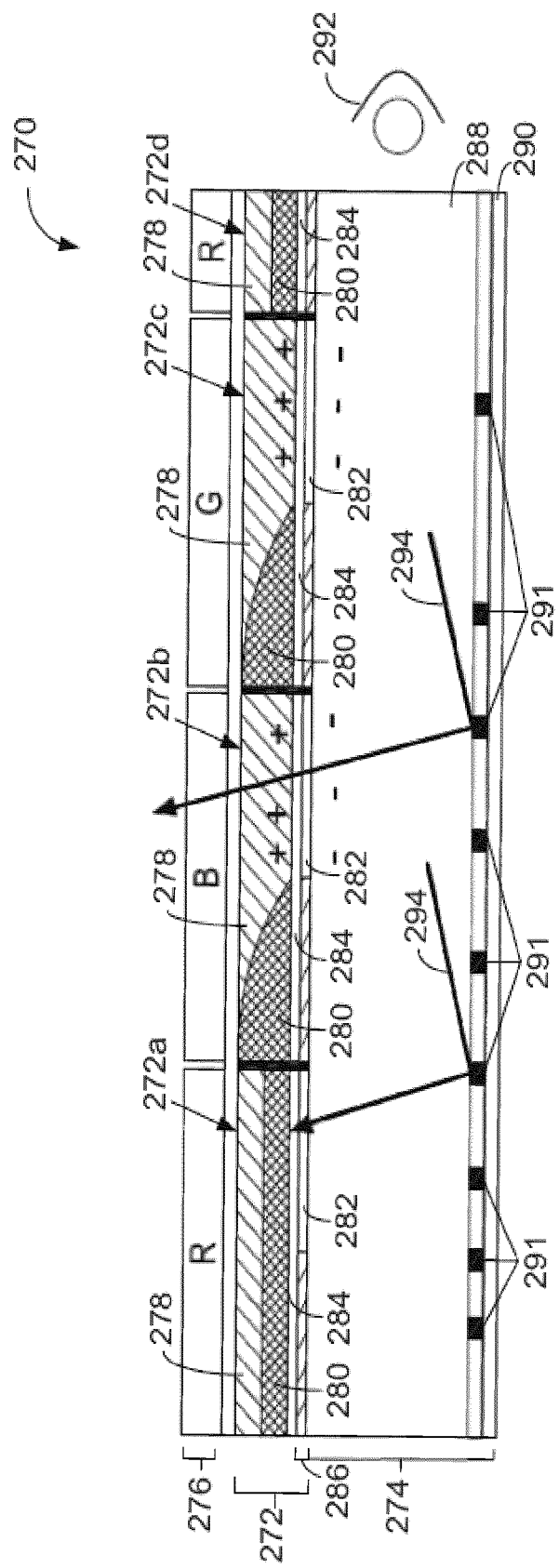
FIG. 2D shows a cross sectional view of an electrowetting-based light modulation array.

FIG. 2D shows an example cross sectional view of an electrowetting-based light modulation array 270. The electrowetting-based light modulation array 270 is suitable for incorporation into an alternative implementation of the MEMS-based display apparatus 100 of FIG. 1A. The light modulation array 270 includes a plurality of electrowetting-based light modulation cells 272a-d (generally "cells 272") formed on an optical cavity 274. The light modulation array 270 also includes a set of color filters 276 corresponding to the cells 272.

Each cell 272 includes a layer of water (or other transparent conductive or polar fluid) 278, a layer of light absorbing oil 280, a transparent electrode 282 (made, for example, from indium-tin oxide (ITO)) and an insulating layer 284 positioned between the layer of light absorbing oil 280 and the transparent electrode 282. In the implementation described herein, the electrode takes up a portion of a rear surface of a cell 272.

The remainder of the rear surface of a cell 272 is formed from a reflective aperture layer 286 that forms the front surface of the optical cavity 274. The reflective aperture layer 286 is formed from a reflective material, such as a reflective metal or a stack of thin films forming a dielectric mirror. For each cell 272, an aperture is formed in the reflective aperture layer 286 to allow light to pass through. The electrode 282 for the cell is deposited in the aperture and over the material forming the reflective aperture layer 286, separated by another dielectric layer.

The remainder of the optical cavity 274 includes a light guide 288 positioned proximate the reflective aperture layer 286, and a second reflective layer 290 on a side of the light guide 288 opposite the reflective aperture layer 286. A series of light redirectors 291 are formed on the rear surface of the light guide, proximate the second reflective layer. The light redirectors 291 may be either diffuse or specular reflectors. One or more light sources 292, such as LEDs, inject light 294 into the light guide 288.

In an alternative implementation, an additional transparent substrate (not shown) is positioned between the light guide 288 and the light modulation array 270. In this implementation, the reflective aperture layer 286 is formed on the additional transparent substrate instead of on the surface of the light guide 288.

In operation, application of a voltage to the electrode 282 of a cell (for example, cell 272b or 272c) causes the light absorbing oil 280 in the cell to collect in one portion of the cell 272. As a result, the light absorbing oil 280 no longer obstructs the passage of light through the aperture formed in the reflective aperture layer 286 (see, for example, cells 272b and 272c). Light escaping the backlight at the aperture is then able to escape through the cell and through a corresponding color filter (for example, red, green or blue) in the set of color filters 276 to form a color pixel in an image. When the electrode 282 is grounded, the light absorbing oil 280 covers the aperture in the reflective aperture layer 286, absorbing any light 294 attempting to pass through it.

The area under which oil 280 collects when a voltage is applied to the cell 272 constitutes wasted space in relation to forming an image. This area is non-transmissive, whether a voltage is applied or not. Therefore, without the inclusion of the reflective portions of reflective apertures layer 286, this area absorbs light that otherwise could be used to contribute to the formation of an image. However, with the inclusion of the reflective aperture layer 286, this light, which otherwise would have been absorbed, is reflected back into the light guide 290 for future escape through a different aperture. The electrowetting-based light modulation array 270 is not the only example of a non-shutter-based MEMS modulator suitable for inclusion in the display apparatus described herein. Other forms of non-shutter-based MEMS modulators could likewise be controlled by various ones of the controller functions described herein without departing from the scope of this disclosure.

Figure 3B:
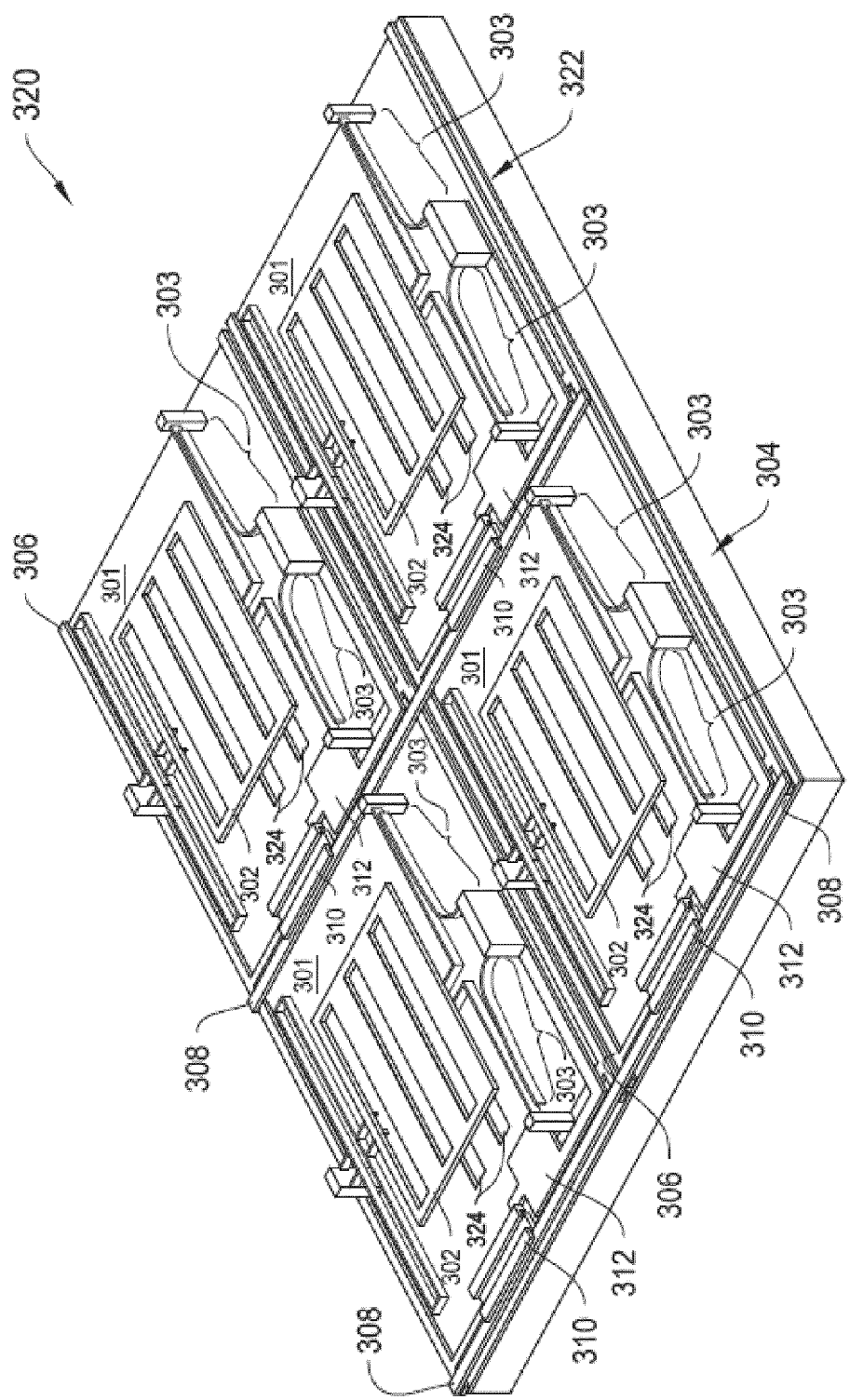
FIG. 3B shows a perspective view of an array of shutter-based light modulators connected to the control matrix of FIG. 3A.

FIG. 3A shows an example schematic diagram of a control matrix 300. The control matrix 300 is suitable for controlling the light modulators incorporated into the MEMS-based display apparatus 100 of FIG. 1A. FIG. 3B shows a perspective view of an array 320 of shutter-based light modulators connected to the control matrix 300 of FIG. 3A. The control matrix 300 may address an array of pixels 320 (the "array 320"). Each pixel 301 can include an elastic shutter assembly 302, such as the shutter assembly 200 of FIG. 2A, controlled by an actuator 303. Each pixel also can include an aperture layer 322 that includes apertures 324.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source 309 ("$V_d$ source") to the pixels 301 in a corresponding column of pixels. In the control matrix 300, the $V_d$ source 309 provides the majority of the energy to be used for actuation of the shutter assemblies 302. Thus, the data voltage source, $V_d$ source 309, also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying $V_{we}$ to each scan-line interconnect 306 in turn. For a write-enabled row, the application of $V_{we}$ to the gates of the transistors 310 of the pixels 301 in the row allows the flow of current through the data interconnects 308 through the transistors 310 to apply a potential to the actuator 303 of the shutter assembly 302. While the row is write-enabled, data voltages $V_d$ are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed $V_{at}$ (the actuation threshold voltage). In response to the application of $V_{at}$ to a data interconnect 308, the actuator 303 in the corresponding shutter assembly actuates, opening the shutter in that shutter assembly 302. The voltage applied to the data interconnect 308 remains stored in the capacitor 312 of the pixel 301 even after the control matrix 300 ceases to apply $V_{we}$ to a row. Therefore, the voltage $V_{we}$ does not have to wait and hold on a row for times long enough for the shutter assembly 302 to actuate; such actuation can proceed after the write-enabling voltage has been removed from the row. The capacitors 312 also function as memory elements within the array 320, storing actuation instructions for the illumination of an image frame.

The pixels 301 as well as the control matrix 300 of the array 320 are formed on a substrate 304. The array includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic. In some other implementations, the substrate 304 is made of an opaque material, but in which holes are etched to form the apertures 324.

The shutter assembly 302 together with the actuator 303 can be made bi-stable. That is, the shutters can exist in at least two equilibrium positions (e.g., open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as spring 207 in the shutter-based light modulator 200 depicted in FIG. 2A, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary "on" or "off" optical states in each pixel. Certain forms of coded area division gray scale are possible where multiple MEMS light modulators in the pixel are provided, and where apertures 324, which are associated with each of the light modulators, have unequal areas.

In some other implementations, the roller-based light modulator 220, the light tap 250, or the electrowetting-based light modulation array 270, as well as other MEMS-based light modulators, can be substituted for the shutter assembly 302 within the light modulator array 320.

FIGS. 4A and 4B show example views of a dual actuator shutter assembly 400. The dual actuator shutter assembly, as depicted in FIG. 4A, is in an open state. FIG. 4B shows the dual actuator shutter assembly 400 in a closed state. In contrast to the shutter assembly 200, the shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both of the actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with the shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of the shutter apertures 412 coincide with the centerlines of two of the aperture layer apertures 409. In FIG. 4B the shutter assembly 400 has been moved to the closed state and, as such, the shutter-open actuator 402 is in its relaxed position, the shutter-close actuator 404 has been actuated, and the light blocking portions of shutter 406 are now in position to block transmission of light through the apertures 409 (depicted as dotted lines).

Each aperture has at least one edge around its periphery. For example, the rectangular apertures 409 have four edges. In alternative implementations in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in aperture layer 407.

The electrostatic actuators 402 and 404 are designed so that their voltage-displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage $V_m$.

Figure 5:
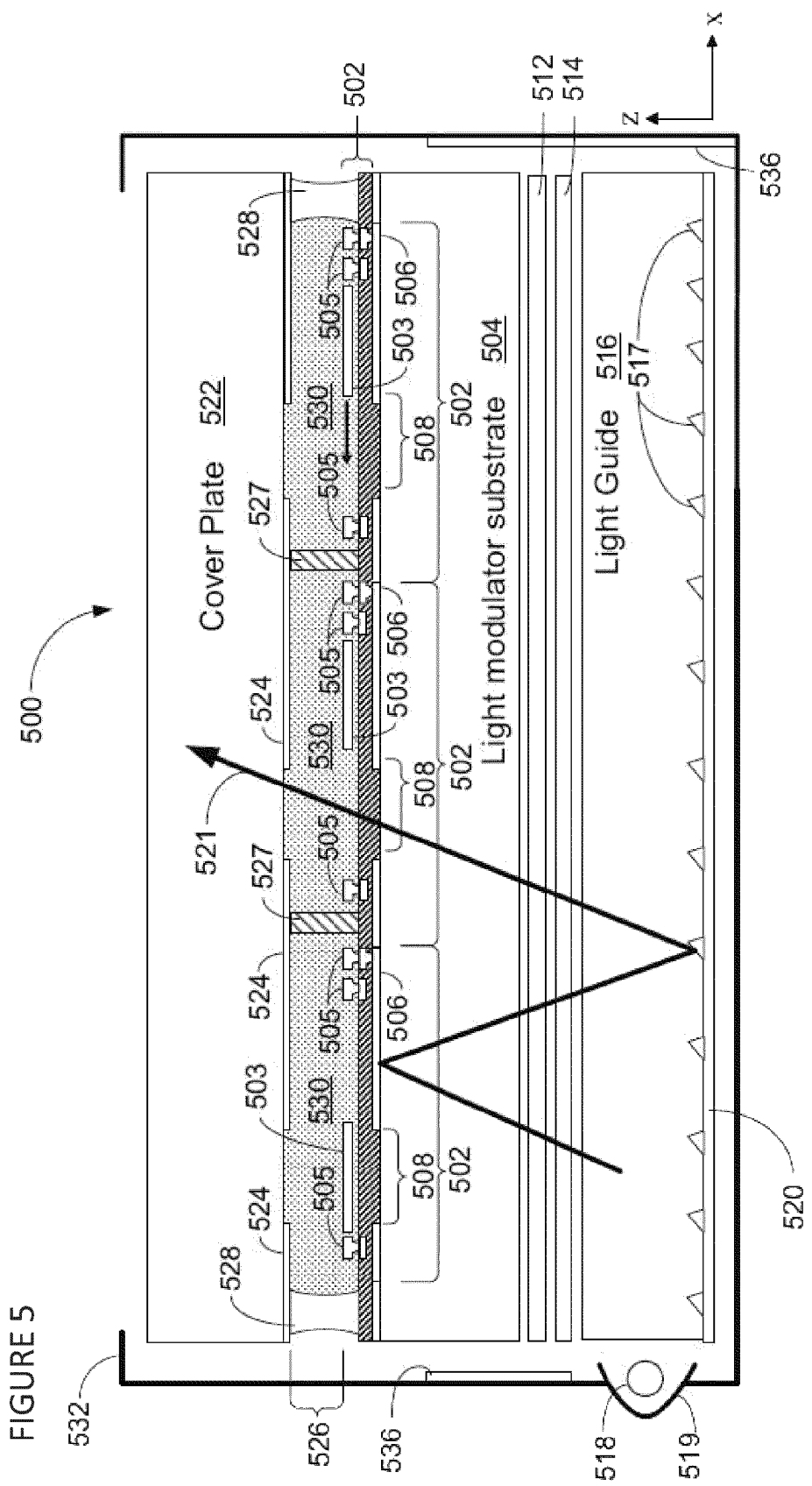
FIG. 5 shows an example cross sectional view of a display apparatus incorporating shutter-based light modulators.

FIG. 5 shows an example cross sectional view of a display apparatus 500 incorporating shutter-based light modulators (shutter assemblies) 502. Each shutter assembly incorporates a shutter 503 and an anchor 505. Not shown are the compliant beam actuators which, when connected between the anchors 505 and the shutters 503, help to suspend the shutters a short distance above the surface. The shutter assemblies 502 are disposed on a transparent substrate 504, preferably made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition. In another implementation, the rear-facing reflective layer 506 can be formed from a mirror, such as a dielectric mirror. A dielectric mirror can be fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state, such as the overlap 416 depicted in FIG. 4B.

The display apparatus 500 includes an optional diffuser 512 and/or an optional brightness enhancing film 514 which separate the substrate 504 from a planar light guide 516. The light guide includes a transparent, i.e., glass or plastic material. The light guide 516 is illuminated by one or more light sources 518, forming a backlight. The light sources 518 can be, for example, and without limitation, incandescent lamps, fluorescent lamps, lasers or light emitting diodes (LEDs). A reflector 519 helps direct light from lamp 518 towards the light guide 516. A front-facing reflective film 520 is disposed behind the backlight 516, reflecting light towards the shutter assemblies 502. Light rays such as ray 521 from the backlight that do not pass through one of the shutter assemblies 502 will be returned to the backlight and reflected again from the film 520. In this fashion light that fails to leave the display to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light re-directors can be molded into the plastic body of light guide 516 with shapes that can be alternately triangular, trapezoidal, or curved in cross section. The density of the prisms 517 generally increases with distance from the lamp 518.

In some implementations, the aperture layer 506 can be made of a light absorbing material, and in alternate implementations the surfaces of shutter 503 can be coated with either a light absorbing or a light reflecting material. In some other implementations, the aperture layer 506 can be deposited directly on the surface of the light guide 516. In some implementations, the aperture layer 506 need not be disposed on the same substrate as the shutters 503 and anchors 505 (such as in the MEMS-down configuration described below).

In some implementations, the light sources 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about $10^4$ V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid) and sealing the fluid (e.g., with an adhesive) within a fluid space or gap in a MEMS display cell. The fluid is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In order to reduce the actuation voltages, the liquid has a viscosity preferably below 70 centipoise, more preferably below 10 centipoise. Liquids with viscosities below 70 centipoise can include materials with low molecular weights: below 4000 grams/mole, or in some cases below 400 grams/mole. Suitable fluids 530 include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. And other fluids considered for these display assemblies include butyl acetate, dimethylformamide. Still other useful fluids for these displays include hydro fluoro ethers, perfluoropolyethers, hydro fluoro poly ethers, pentanol, butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight 516 and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of light guide 516 back into the light guide. Not depicted in FIG. 5 are electrical interconnects which provide control signals as well as power to the shutter assemblies 502 and the lamps 518.

In some other implementations, the roller-based light modulator 220, the light tap 250, or the electrowetting-based light modulation array 270, as depicted in FIGS. 2A-2D, as well as other MEMS-based light modulators, can be substituted for the shutter assemblies 502 within the display apparatus 500.

The display apparatus 500 is referred to as the MEMS-up configuration, wherein the MEMS based light modulators are formed on a front surface of substrate 504, i.e., the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in display apparatus 500 and is oriented such that the MEMS-based light modulators are positioned on the rear surface of the top substrate, i.e., the surface that faces away from the viewer and toward the back light 516. The MEMS-based light modulators are thereby positioned directly opposite to and across a gap from the reflective aperture layer. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 6:
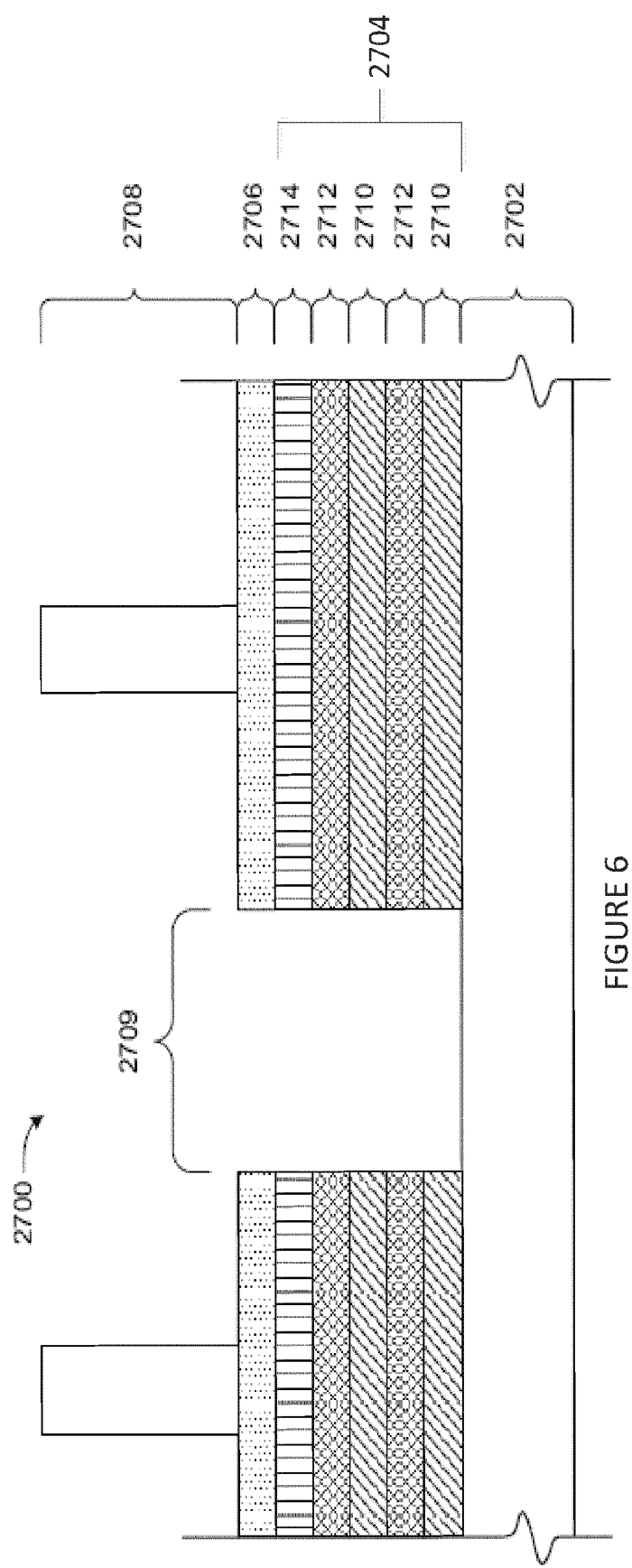
FIG. 6 shows an example cross sectional view of structures of an aperture plate for use in a MEMS-down configuration of a display.

FIG. 6 shows an example cross sectional view of structures of an aperture plate for use in a MEMS-down configuration. The aperture plate 2700 includes a substrate 2702, a dielectrically enhanced metal mirror 2704, a light absorbing layer 2706, and a spacer post 2708. The dielectrically enhanced metal mirror and the light absorbing layer have been patterned into apertures 2709.

The substrate 2702 is preferably a transparent material, for example glass or plastic. The dielectrically enhanced metal mirror 2704 includes a 5-layer stack of materials including, in order from the substrate up, a thin film of silicon nitride ($Si_3N_4$) 2710, a thin film of silicon dioxide ($SiO_2$) 2712, another thin film of $Si_3N_4$ 2710, another thin film of $SiO_2$, 2712, and a thin film of aluminum (Al) 2714. The relative thicknesses and preferred refractive indices of these layers are given in Table 1. Other suitable alternative dielectrics include titanium oxide ($TiO_2$), tantalum pentoxide ($Ta_2O_5$), zirconium oxide ($ZrO_2$), hafnium oxide ($HfO_2$), aluminum oxide ($Al_2O_3$), and Yittrium oxide ($Y_2O_3$).

TABLE 1

Film Thicknesses and Refractive Indices for a Dielectrically Enhanced Metal Mirror.

| Thin film material | Thickness | Refractive index |
|---|---|---|
| 5. Aluminum | 200 nm or less | NA |
| 4. $SiO_2$ | 88 nm | 1.46 |
| 3. $Si_3N_4$ | 64 nm | 2.0 |
| 2. $SiO_2$ | 88 nm | 1.46 |
| 1. $Si_3N_4$ | 64 nm | 2.0 |

The light absorbing layer 2706 can be formed from a thin film of black chrome, which is a composite of chromium metal particles suspended in an oxide or nitride matrix. Examples include chromium (Cr) particles in a chromium (III) oxide ($Cr_2O_3$) matrix or Cr particles in an $SiO_2$ matrix. In other implementations black chrome can be formed from a thin metal film of chromium upon which a thin film of $CrO_x$ (a sub-oxide of chromium) has been either grown or deposited. A preferred thickness for the black chrome is 150 nm. Other suitable light absorbing materials are disclosed in relation to FIG. 9.

The aperture windows 2709 can be patterned from the thin film stack of materials 2704 and 2706 by processes known in the art such as photolithography and etch or by photolithography and lift-off. In the etch process a layer of photoresist is added to the top of the thin film stack and then exposed to UV light through a mask. After developing the aperture pattern in the exposed layer of photoresist, the whole stack is etched in the region of apertures 2709 down to the substrate 2702. Such etching may be accomplished by immersion in wet chemicals, by a dry plasma or ion beam etch, or any combination of the above. In the lift-off process the layer of photoresist is added to the glass before deposition of the thin film stack, the resist being developed into a pattern that is a reverse of the etch mask pattern. The thin film stack is then deposited over the top of the photoresist, such that the thin film stack makes contact to the glass everywhere except in the regions of the apertures 2709. After deposition of the thin film stack is complete, the substrate is dipped into a bath of chemicals that dissolves or lifts-off the photoresist as well as any thin film materials that were deposited on top of the photoresist.

The spacer post 2708 is formed from a photo-imageable polymer such as such as a photo-imageable epoxy (in particular a novolac epoxy) or a photo-imageable polyimide material. Other polymer families that can be prepared in photo-imageable form and are useful for this application include polyarylene, parylene, benzocyclobutane, perfluorocyclobutane, silsequioxane, and silicone polymers. A particular photo-imageable resist useful for the spacer application is the Nano SU-8 material available from Microchem Corporation, headquartered in Newton, Mass.

The polymer spacer material is initially deposited as a thick film on top of the thin film stack 2704 and 2706 after the apertures 2709 have been patterned. The photo-imageable polymer is then exposed to UV light through a mask. Alignment marks can help to ensure that the resultant spacer posts 2708 are located correctly with respect to apertures 2709. For instance, alignment fiducials (i.e., recognition marks for optical alignment systems) can be formed on the periphery of the display during the process of etching the apertures 2709. These fiducials are then aligned to a corresponding set of fiducials on the exposure mask to ensure a correct location of spacer posts 2708. A developing process is then effective at removing all of the polymer except where it was exposed to the UV light. In an alternate method, the features on the exposure mask may be aligned directly to display features on the substrate 2702, such as the apertures 2709.

In some implementations, the spacer posts 2708 can be 8 microns tall. In some other implementations, spacer heights may range from about 2 microns to about 50 microns, such as 4 or 12 microns. When cross sectioned in the plane of the substrate 2702, the spacers may take regular shapes such as a cylinder or a rectangle with widths in the range of 2 to 50 microns, such as 4 or 12 microns. Alternately, they can have complex irregular cross sections which are designed to maximize the contact area of the spacer while fitting between other structures on the substrate, such as apertures 2709. In some implementations, the spacer size, shape and placement is determined so that the spacers do not interfere with the movement of active MEMS components.

In another implementation, the spacer post 2708 is not provided as a polymer material but is instead composed of a heat re-flowable joining material, such as a solder alloy. The solder alloy can pass through a melting or re-flow block which allows the solder alloy to wet or bond to a mating surface on the opposing substrate. The solder alloy therefore performs an additional function as a joining material between an aperture plate and a modulator substrate. Because of the reflow process, the solder alloy typically relaxes to an oblate shape referred to as the solder bump. A predetermined spacing between substrates can be maintained through control over the average volume of material in the solder bump. Solder bumps can be applied to aperture plate 2700 by means of thin film deposition, by thick film deposition through a stencil mask, or by electroplating.

In another implementation, the aperture plate 2700 can be subjected to a sandblasting treatment after forming the optical layers 2704 and 2706. The sandblasting has the effect of roughening the substrate surface selectively in the regions of the aperture 2709. A roughened surface at aperture 2709 behaves as an optical diffuser which can provide the benefits of a wider viewing angle for the display. In another implementation, a diffusing surface at aperture 2709 is provided by means of an etching process, where the etch is selectively applied in the regions of apertures 2709 after exposure of photoresist to a photomask. Etch pits or trenches can be created through proper design of the photomask, and the sidewall angles or depths of the pits or trenches can be controlled by means of either a wet or dry etch process. In this fashion optical structures with controlled degrees of diffusive broadening can be created. In this fashion anisotropic diffusers can be created at the substrate surface which deflect light along a preferred optical axis, creating elliptical and/or multi-directional cones of emitted light.

In some implementations, an etched trench can be provided in substrate 2702 that substantially surrounds the display along the periphery of the array of apertures 2709 (i.e. around the periphery of the active display region). The etched trench performs as a mechanical locating structure for restricting the motion or flowing of an adhesive used to seal aperture plate 2700 to an opposing substrate.

In some implementations, it is desirable to employ a transparent plastic material for the substrate 2702. Applicable plastics include, without limitation, polymethylmethacrylate (PMMA) and polycarbonate. When plastic materials are used, it also becomes possible to utilize an injection molding or stamping process for the formation of spacer posts 2708. In such a process, the spacer posts 2708 are formed in a mold or a stamper first, before the application of the dielectrically enhanced metal mirror 2704. All of the layers of the dielectrically enhanced metal mirror 2704 would be then be deposited in sequence on top of the substrate which already includes spacer posts 2708. The light absorbing layer 2706 is deposited on top of the dielectric mirror 2704. In order to pattern the aperture window 2709 a special photoresist is applied that uniformly coats the surfaces of the thin films without being disrupted by the presence of spacer posts 2708. Suitable photoresists include spray-on photoresists and electroplated photoresists. Alternately, a spin-on resist is applied followed by a reflow block that provides an even resist thickness across the thin film surfaces in the areas of apertures 2709. The exposure of the resist, developing, and etching of the thin film layers then proceeds as described above. After the removal of the photoresist, the process is complete. A liftoff process also can be employed to pattern the dielectrically enhanced mirror as described above. The use of a molding or stamping process for the formation of spacer posts 2708 helps to reduce the material costs required in the fabrication of aperture plate 2700.

In some display implementations, the aperture plate is combined with a light guide into one solid body, referred to herein as a unitary or composite backlight. All of the processes described above for the formation of the dielectrically enhanced metal mirror 2704, for the light absorbing layer 2706, and/or for the spacer posts 2708 can be similarly applied to a substrate which is bonded to or otherwise indistinguishable from the light guide. The surface of the unitary backlight onto which the thin films are applied can be glass, or it could be plastic, including a plastic which has been molded to form spacer posts.

In some implementations, the spacer posts 2708 are formed or attached to aperture plate 2700 before the aperture plate is aligned to a modulator substrate. In an alternative implementation, the spacer posts 2708 are fabricated on top of and as a part of a light modulator substrate, such as the substrate 504 of FIG. 5, before the light modulator substrate is aligned to an aperture plate.

Figure 7:
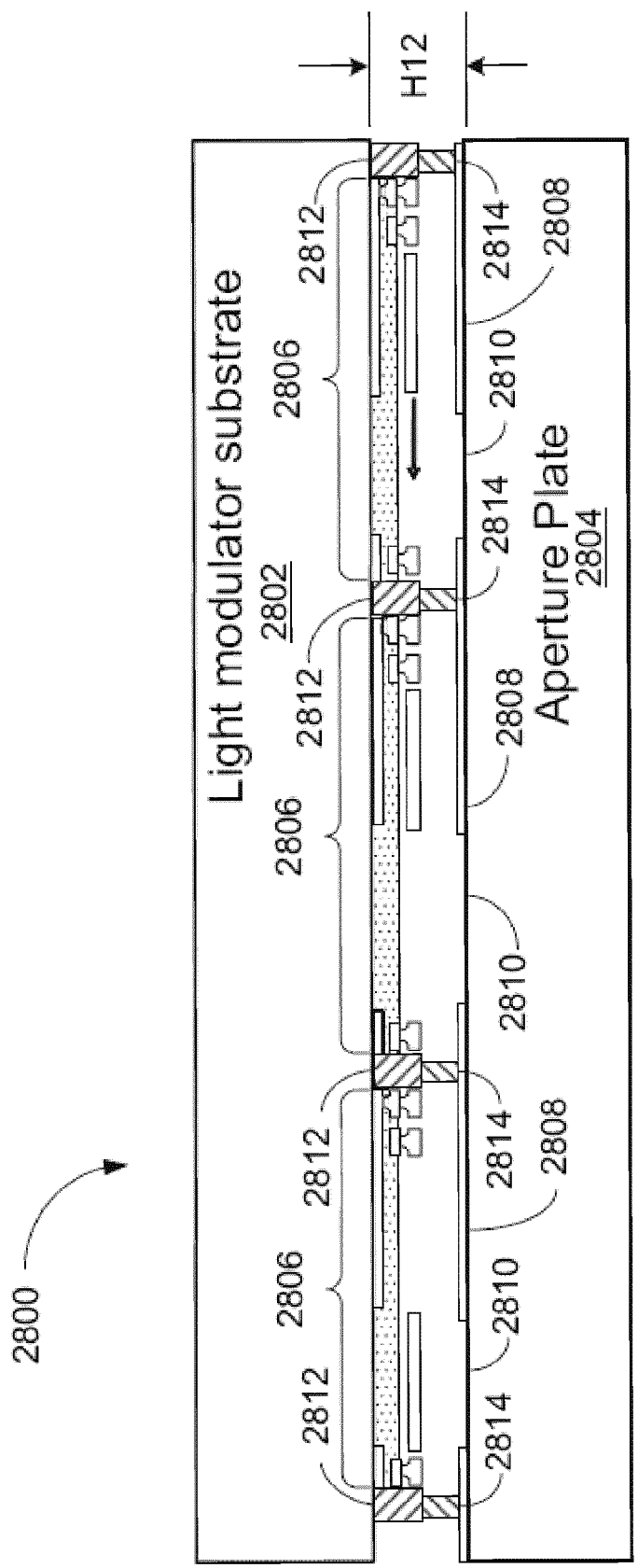
FIG. 7 shows a cross sectional view of a light modulator substrate and an aperture plate for use in a MEMS-down configuration of a display.

FIG. 7 shows a cross sectional view of a light modulator substrate and an aperture plate for use in a MEMS-down configuration of a display. The display assembly 2800 includes a modulator substrate 2802 and an aperture plate 2804. The display assembly 2800 also includes a set of shutter assemblies 2806 and a reflective aperture layer 2808. The reflective aperture layer 2805 includes apertures 2810. A predetermined gap or separation between the substrate 2802 and 2804 is maintained by the opposing set of spacers 2812 and 2814. The spacers 2812 are formed on or as part of the modulator substrate 2802. The spacers 2814 are formed on or as part of the aperture plate 2804. During assembly, the two substrates 2802 and 2804 are aligned so that spacers 2812 on the modulator substrate 2802 make contact with their respective spacers 2814.

The separation or distance of this illustrative example is 8 microns. To establish this separation, the spacers 2812 are 2 microns tall and the spacers 2814 are 6 microns tall. Alternately, both spacers 2812 and 2814 can be 4 microns tall, or the spacers 2812 can be 6 microns tall while the spacers 2814 are 2 microns tall. In fact, any combination of spacer heights can be employed as long as their total height establishes the desired separation H12.

Providing spacers on both of the substrates 2802 and 2804, which are then aligned or mated during assembly, has advantages with respect to materials and processing costs. The provision of a very tall, such as larger than 8 micron spacers, can be costly as it can require relatively long times for the cure, exposure, and development of a photo-imageable polymer. The use of mating spacers as in display assembly 2800 allows for the use of thinner coatings of the polymer on each of the substrates.

In another implementation, the spacers 2812 which are formed on the modulator substrate 2802 can be formed from the same materials and patterning blocks that were used to form the shutter assemblies 2806. For instance, the anchors employed for shutter assemblies 2806 also can perform a function similar to spacer 2812. In this implementation, a separate application of a polymer material to form a spacer would not be required and a separate exposure mask for the spacers would not be required.

Typically, spacers can be expensive to fabricate because they typically are fabricated in a separate process from that used to fabricate the rest of the mechanical features of a MEMS display apparatus. This is because the spacers must be both sufficiently narrow because they are located between MEMS light modulators and sufficiently tall so that they provide a sufficient gap between the two substrates. Providing spacers that are sufficiently tall involve a cumbersome fabrication process that includes long times for the cure, exposure, and development of the photo-imageable sacrificial polymer material. Improvements and cost reductions in the process for forming spacers can be realized if spacers are formed using the same materials and with substantially similar processing steps as used to form other portions of the display apparatus, such as the shutter assemblies. As will be described further below, a single fabrication process can be employed to fabricate both the spacers and the MEMS anchor structures. In addition to achieving cost reductions by using only a single fabrication process, employing a single fabrication process can result in the fabrication of anchors that are sufficiently resilient that they also may serve as spacers.

FIG. 8 is a flow diagram of a fabrication process 800 for simultaneously fabricating spacers and anchors on a substrate for use in a display apparatus. FIGS. 9A-9G show cross-sectional views of stages of construction of an example spacer and anchor assembly 900 using the fabrication process 800 of FIG. 8 described below.

Referring now to FIGS. 8 and 9A-9G, the fabrication process 800 begins with depositing a first sacrificial polymer layer 904 on a first substrate 902 (block 802). The first sacrificial polymer layer 904 is patterned and cured (block 804). A second sacrificial polymer layer 906 is deposited on the first sacrificial polymer layer 904 (block 806). The second sacrificial polymer layer 906 is patterned and cured (block 808). A layer of structural material 908 is deposited on the first and second sacrificial polymer layers 904 and 906 (block 810). The layer of structural material 908 is then patterned and etched (block 812). Portions of the remaining sacrificial polymer layers are then removed (block 814). By way of this fabrication process 800, an integrated anchor-spacer structure, which includes portions of the first and second sacrificial polymer layers 904 and 906 encapsulated by the layer of structural material 908, is formed on the first substrate 902. Each of these stages is described in further detail below.

As set forth above, the fabrication process 800 begins with the deposition of a first sacrificial polymer layer 904 on a first substrate 902 (block 802). For displays built with a MEMS-up configuration, the first substrate 902 can be an aperture layer, such as the light modulation substrate 504 depicted in FIG. 5. For displays built with a MEMS-down configuration, the first substrate 902 can be the light modulator substrate 2802 depicted in FIG. 7. The sacrificial polymer layer 904 can be formed from a photo-imageable polymer resist, such as a photo-imageable epoxy, for e.g., a novolac epoxy, or a photo-imageable polyimide material. Other polymer families that can be prepared in photo-imageable resist form that may be used as the first sacrificial layer include polyarylene, parylene, benzocyclobutane, perfluorocyclobutane, silsequioxane, silicone polymers, or any combination thereof. In some implementations, the first polymer layer can include a photo-imageable resist commercially known as Nano SU-8 material available from Microchem Corporation, headquartered in Newton, Mass. Other non-photo imageable resists, such as thermoplastic or thermoset polymers used in imprint or other lithography processes also may be employed.

Figure 9A:
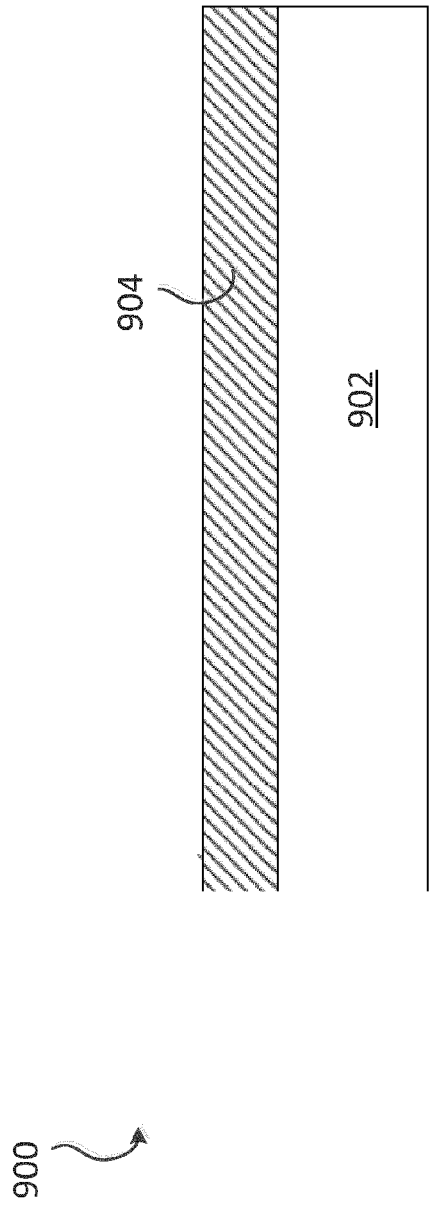
FIGS. 9A-9G show cross sectional views of stages of construction of an example spacer and anchor assembly using the fabrication process of FIG. 8.
Figure 9B:
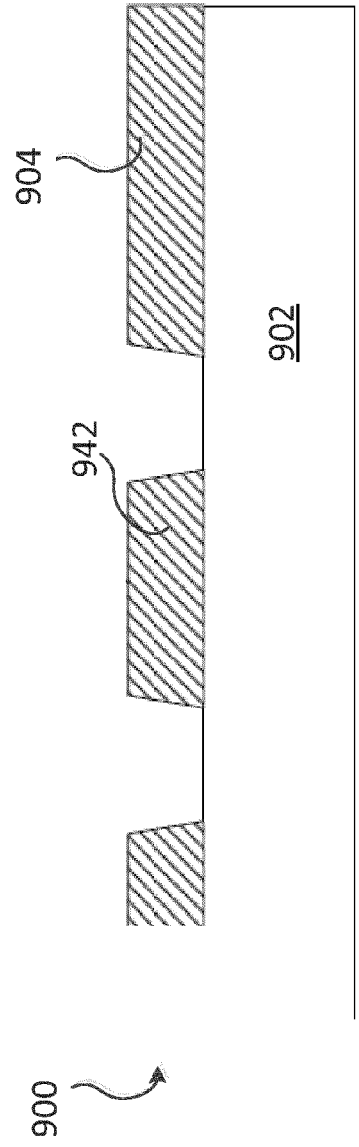

After depositing the first sacrificial polymer layer 904 on the first substrate 902 (block 802), the deposited first sacrificial layer 904 is patterned and cured (block 804). In some implementations, the deposited first sacrificial layer 904 is formulated to allow for many alternate types of curing, including desiccation curing, UV or ultraviolet curing, thermal curing, or microwave curing. In some implementations, the curing process for this polymer is performed at a temperature of approximately 220 degrees Celsius. As part of the patterning process, the first polymer layer is patterned to form portions of the spacers and the anchors. The result of the patterning and curing step (block 804) is depicted in FIG. 9B, where a first spacer portion 942 is formed.

Figure 9C:
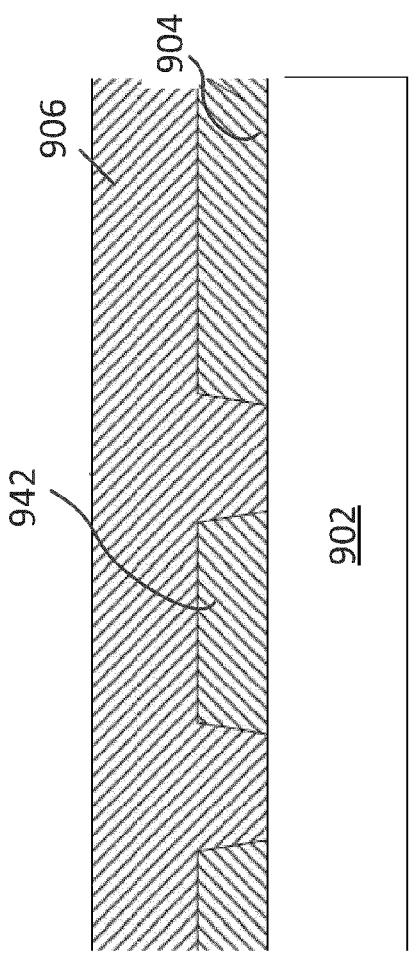

After patterning and curing the first sacrificial polymer layer 904 (block 804) of the assembly 900, a second sacrificial polymer layer 906 is deposited (block 806) on the assembly 900, the resulting assembly 900 is depicted in FIG. 9C. The second sacrificial polymer layer 906 can be deposited such that it encapsulates exposed surfaces of the assembly 900. The second sacrificial polymer layer 906 is formed from one or more of the polymer materials provided above that can be used to form the first sacrificial polymer layer 904. In some implementations, the second polymer layer 906 may be formed from the same polymer material used to form the first sacrificial polymer layer 904.

Figure 9D:
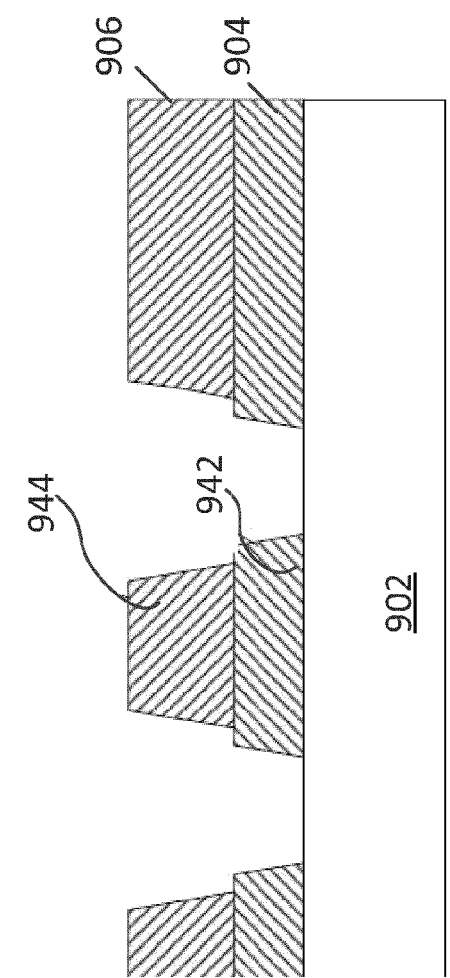

The deposited second sacrificial polymer layer 906 is then patterned and cured (block 808). In particular, the second sacrificial polymer layer 906 is patterned to form a second spacer portion 944. In some implementations of the second sacrificial polymer layer patterning process, the second spacer portion 944 is patterned such that it does not encapsulate the first spacer portion 942 (as depicted in FIG. 9D). In this way, the first spacer portion 942 includes at least one surface 943 that is exposed. In some other implementations of the patterning process, the second polymer layer 906 is patterned such that the second polymer layer 906 encapsulates the first polymer layer 904, as depicted with respect to FIG. 11, which will be described in further detail below. The second sacrificial polymer layer 906 may be cured using a curing technique similar to the curing technique employed for curing the first sacrificial polymer layer 904.

Figures 9E, 9F:
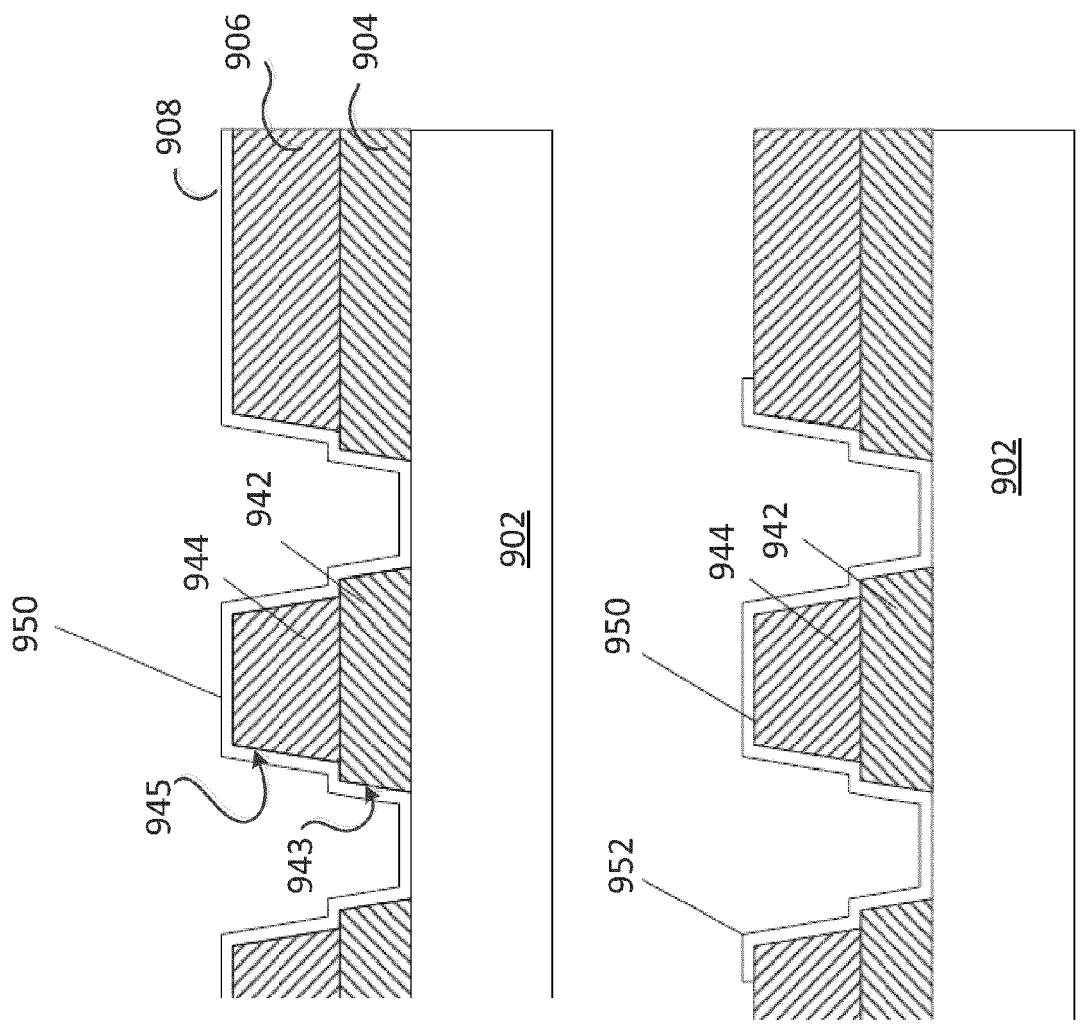

Upon patterning and curing the second sacrificial polymer layer (block 808), a layer of structural material 908 is deposited over the first and second sacrificial layers 904 and 906 (block 810). FIG. 9E shows the result of this process. The layer of structural material 908 can include a single layer of one material, or multiple layers of several different materials. In some implementations, the layer of structural material 908 is deposited such that the layer of structural material 908 contacts and encapsulates the exposed surface 943 of the first spacer portion 942 and an exposed surface 945 of the second spacer polymer portion 944. Depending on the specific materials used to form the layer of structural material, the layer(s) of material that form the layer structural material 908 can be deposited using a variety of deposition techniques including atomic layer deposition (ALD), PECVD, or other chemical vapor deposition techniques. In some implementations, the layer of structural material can include a semiconductor layer and a metallic layer. More particularly, in some implementations, the layer of structural material includes one or more silicon (Si), titanium (Ti), silicon nitride (SiN) and an oxynitride (OxNy).

In some applications, the contrast of the display can be improved by reducing the reflection of ambient light impinging upon the layer of structural material 908. As such, in some implementations, the layer of structural material can be made of a light absorbent material. For example, the layer of structural material can absorb at least about 80% of light impinging on the layer of structural material. Some metal alloys which are effective at absorbing light, i.e., include, without limitation, chromium-molybdenum (MoCr), molybdenum-tungsten (MoW), molybdenum-titanium (MoTi), molybdenum-tantalum (MoTa), titanium-tungsten (TiW), and titanium-chromium (TiCr). Metal films formed from the above alloys or simple metals, such as nickel (Ni) and chromium (Cr) with rough surfaces also can be effective at absorbing light. Such films can be produced by sputter deposition in high gas pressures (sputtering atmospheres in excess of 20 millitorr). Rough metal films also can be formed by the liquid spray or plasma spray application of a dispersion of metal particles, following by a thermal sintering block. A dielectric layer such as a dielectric layer 404 is then added to prevent spalling or flaking of the metal particles. Semiconductor materials, such as amorphous or polycrystalline silicon (Si), germanium (Ge), cadmium telluride (CdTe), indium gallium Arsenide (InGaAs), colloidal graphite (carbon) and alloys such as silicon-germanium (SiGe) are also effective at absorbing light. These materials can be deposited in films having thicknesses in excess of 500 nm to prevent any transmission of light through the thin film. Metal oxides or nitrides also can be effective at absorbing light, including without limitation copper oxide (CuO), nickel oxide (NiO), chromium (III) oxide ($Cr_2O_3$), silver oxide (AgO), tin oxide (SnO), zinc oxide (ZnO), titanium oxide (TiO), tantalum pentoxide ($Ta_2O_5$), molybdenum trioxide ($MoO_3$), chromium nitride (CrN), titanium nitride (TiN), or tantalum nitride (TaN). The absorption of these oxides or nitrides improves if the oxides are prepared or deposited in non-stoichiometric fashion—often by sputtering or evaporation—especially if the deposition process results in a deficit of oxygen in the lattice. As with semiconductors, the metal oxides should be deposited to thicknesses in excess of, e.g., 500 nm to prevent transmission of light through the film. In addition, a class of materials, called cermets, is also effective at absorbing light. Cermets are typically composites of small metal particles suspended in an oxide or nitride matrix. Examples include Cr particles in a structural material including $Cr_2O_3$ or Cr particles in a structural material including $SiO_2$. Other metal particles suspended in the layer of structural material can be nickel (Ni), titanium (Ti), gold (Au), silver (Ag), molybdenum (Mo), niobium (Nb), and carbon (C). Other matrix materials include tin dioxide ($TiO_2$), tantalum pentoxide ($Ta_2O_5$), aluminum oxide ($Al_2O_3$), and silicon nitride ($Si_3N_4$).

After its deposition, the layer of structural material 908 is patterned and etched (block 812) forming the assembly 900 depicted in FIG. 9F. In some implementations, the layer of structural material 908 is etched using an aggressive etching process.

Figure 9G:
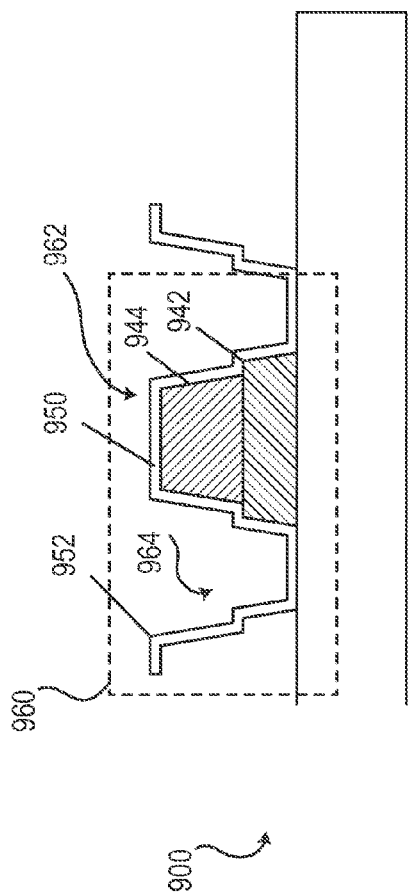

Portions of the first and second sacrificial polymer layers 904 and 906 are then removed (block 814) in a release step, forming an integrated spacer and anchor structure 960 depicted in FIG. 9G. In various implementations, the first and second sacrificial polymer layers 904 and 906 are removed by exposing the spacer and anchor assembly 900 to an oxygen plasma, or in some cases, by thermal pyrolysis. In some implementations, the polymer layers may be removed with either an aqueous or solvent-based stripper compound or plasma ashing. The integrated spacer and anchor structure 960 (the "spacer-anchor 960") is a single structure that serves both as a spacer as well as an anchor for supporting, over the substrate 902, one or more drive beams 1254a or 1254b or a shutter 1270 via a load beam 1256a or 1256b, as depicted in FIG. 12, which is described below. More particularly, the spacer-anchor 960 includes a spacer portion 962 formed from portions of the first and second polymer layers 942 and 944 encapsulated by the layer of structural material 950. The polymer material 942 and 944 encapsulated within the layer of structural material 908 provides greater structural support to the remainder of the spacer-anchor 960, helping prevent it from bending during operation of the display or as the result of physical or environmental stresses. In various implementations, polymer material may be encapsulated under one or more sides of the anchor, depending on the spacer-anchor position and the direction at which the beam or beams attached to the spacer-anchor 962 extend away from it. For example, in some implementations, a drive beam anchor is formed as a rectangular spacer-anchor 960 that encapsulates polymer along three sides (e.g., each of the sides other than the side from which drive beams extend). In some other implementations, a load beam anchor is formed as a rectangular spacer-anchor 960 that encapsulates polymer along two sides (e.g., a side facing a drive beam anchor and a side facing away from a shutter).

Figure 10:
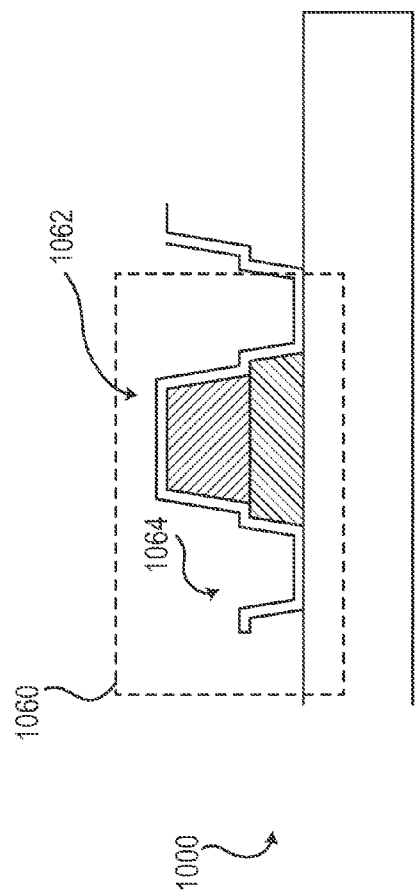
FIG. 10 shows an example cross sectional view of an alternate configuration of an anchor and shutter assembly.

FIG. 10 shows an example cross-sectional view of an alternate configuration of an anchor and shutter assembly 1000. The anchor and shutter assembly 1000 includes an integrated spacer and anchor structure 1060, which includes a spacer portion 1062 that is similar to the spacer portion 962 depicted in FIG. 9G, and a lower anchor structure 1064. The anchor structure 964 can support a corresponding MEMS structure (not shown) that can be fabricated together with the anchor and shutter assembly 1000. The integrated spacer and anchor structure 1060 omits the upper portion of one anchor wall included in the integrated spacer and anchor structure 960. This wall faces the risk of being broken if spacers extending from an opposing substrate are misaligned sufficiently that they come into contact with the anchor wall, as opposed to the spacer portion 962, as intended. The wall, if broken, could interfere with the other components of the assembly 900. By eliminating this wall, as depicted in FIG. 10, this risk is mitigated.

Figure 11:
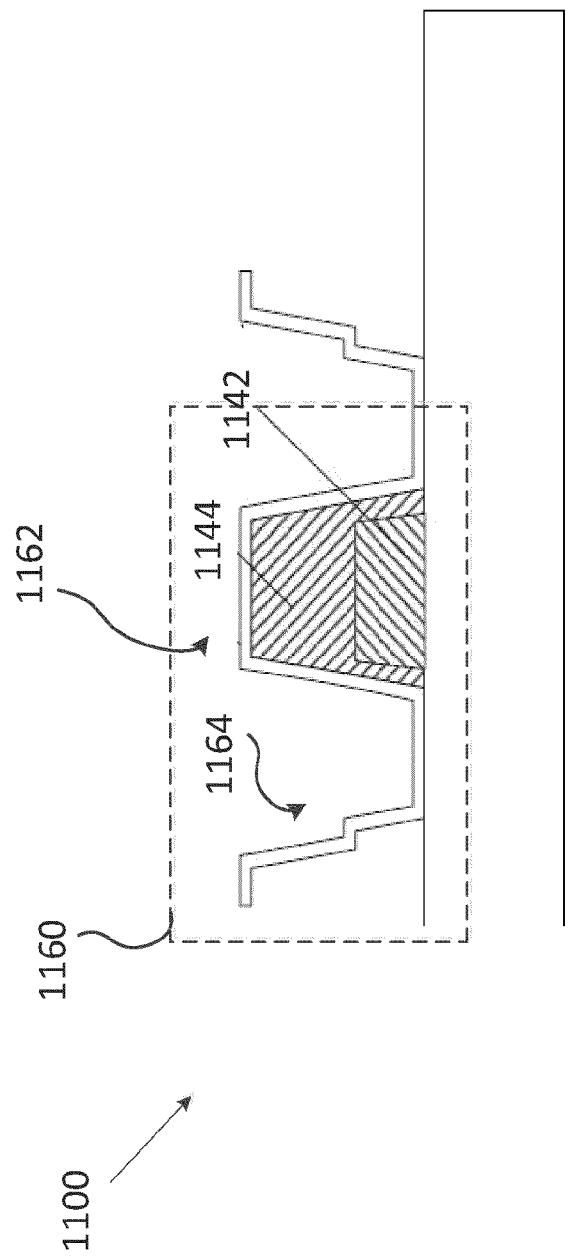
FIG. 11 shows an example cross sectional view of another alternate configuration of an anchor and shutter assembly.

FIG. 11 shows an example cross-sectional view of another alternate configuration of an anchor and shutter assembly 1100. The anchor and shutter assembly 1100 includes an integrated spacer and anchor structure 1160 (the "spacer-anchor 1160") that includes an anchor portion 1164 having a spacer portion 1162. The spacer portion 1162 is different from the spacer portion 962 depicted in FIG. 9G, in that the spacer portion 1162 includes a second spacer portion 1144 formed from the second polymer layer 906 that encapsulates a first spacer portion 1142 formed from the first polymer layer 904. In other words, the second spacer portion 1144 is in contact with every surface of the first spacer portion not in contact with the first substrate 1102. In turn, the layer of structural material 1150 contacts the second spacer portion 1144 but does not contact any surface of the first spacer portion 1142. Specifically, to fabricate such a configuration, the second sacrificial polymer layer 1106 that is deposited on the first spacer portion 1142 is patterned in such a manner that does not expose the surface 1143 of the first spacer portion 1142.

FIG. 12A shows an example cross-sectional view of an anchor and shutter assembly 1200. The anchor and spacer assembly 1200 includes a first integrated spacer and anchor structure 1260a and a second integrated spacer and anchor structure 1260b, ("spacer-anchors 1260a and 1260b") that are configured to support a shutter assembly. In this configuration, the spacer-anchors 1260a and 1260b are similar to the spacer-anchor 960 depicted in FIG. 9G. The shutter assembly includes a shutter 1270, a first drive beam 1254a and a first load beam 1256a, and a second drive beam 1254a and a second load beam 1256b. Similar to the drive and load beams described with respect to FIG. 2A, the drive and load beams 1254a, 1254b, 1256a and 1256b are configured to move the shutter 1270 between an open and closed position.

FIG. 12B shows an example cross-sectional view of an anchor and shutter assembly 1210. The anchor and shutter assembly 1210 is similar to the anchor and spacer assembly 1200 depicted in FIG. 12A in that the anchor and spacer assembly 1210 includes similar drive and load beams 1254a and 1254b, and 1256a and 1256b, respectively. However, the anchor and shutter assembly 1210 differs from the anchor and shutter assembly 1200 in that the anchor and shutter assembly 1210 includes a first integrated spacer and anchor assembly 1280a and a second integrated spacer and anchor assembly 1280b ("spacer-anchors 1280a and 1280b") that are configured to support a shutter assembly including the shutter 1270. In this configuration, the spacer-anchors 1260a and 1260b are similar to the spacer-anchors 1160 depicted in FIG. 11.

FIG. 13 shows an example cross sectional view of an anchor 1302 and a separate spacer 1304 formed on a substrate 1306 by a single fabrication process. In contrast to the integrated spacer and anchor structures 1262 and 1282 described with respect to FIGS. 12A and 12B, the anchor 1302 and the spacer 1304 are not connected. A person having ordinary skill in the art may readily appreciate that although the spacer 1304 is similar to the spacer portion 1262 depicted in FIG. 12A, the spacer 1304 also can be similar to the spacer portion 1282 depicted in FIG. 12B. In some implementations where the spacers are to be positioned away from the anchors, the configuration depicted in FIG. 13 may be suitable for use.

As set forth above, fluids can be used to immerse moving components of MEMS devices, such as MEMS light modulators. Inclusion of a fluid surrounding the mechanical light modulators may introduce some drawbacks, however. In particular, sudden impacts on the display surface can result in fluid flows or pressure waves being propagated through the fluid across the display. These flows or waves can damage the light modulators.

To protect against this risk, fluid barriers can be integrated into the display to shield the light modulators against propagating waves or fluid flows. In some implementations, these fluid barriers can serve a secondary purpose by acting as spacers. In fact, the fluid barriers can be fabricated in the same process described above with respect to the formation of spacers described with respect to FIG. 8. Thus, the fluid barriers can be formed from multiple patterned polymer layers encapsulated by a layer of structural material, such as the layer of structural material used to form the anchors, actuators or other structural components of the mechanical light modulator.

FIGS. 14A-14D show example fluid barrier configurations for use in display apparatus. As depicted in FIGS. 14A-14D, a shutter assembly 1400 includes a MEMS device, such as a shutter 1402 that is supported by a plurality of anchors, such as the anchor 1404. Referring now specifically to FIG. 14A, a first discontinuous fluid barrier configuration including four fluid barrier structures 1410a-1410d are positioned at the corners of the shutter assembly 1400. In some other implementations, alternate barrier structures, such as the barrier structure 1412 can be positioned in between the drive anchor 1404 and the load anchors, such as load anchor 1405. FIG. 14B shows a different discontinuous fluid barrier configuration, where the fluid barrier structures 1420 are positioned at the four corners and along two sides of the shutter assembly 1400 that are parallel to the direction of movement of the shutter 1402 during normal operation. FIG. 14C shows yet another discontinuous fluid barrier configuration, where the fluid barrier structures 1430 are positioned at the four corners and along all of the sides of the shutter assembly 1400. Each of the fluid barrier structures 1430 are separated from adjacent fluid barrier structures by openings through which fluid can flow to adjacent shutter assemblies. FIG. 14D shows a contiguous fluid barrier configuration, where a single contiguous fluid barrier structure 1440 is positioned to surround the shutter assembly 1400. For implementations in which the fluid barrier extends the full height between opposing substrates, the fluid remains entrapped within the area defined by the fluid barrier structure 1440. The structures are filled by dropping the fluid into the structures prior to placement and alignment of an opposing substrate. In some other implementations, the fluid barrier extends to at least the height of the shutter assembly, but not to the full height of the gap between the substrates, permitting more flexibility in the fluid filling process employed, while still protecting the shutter assemblies. In still some other implementations, fluid barrier structures, such as fluid barrier structures 1410a-1410d are fabricated on the opposing substrate (i.e., the substrate opposite the shutters or other light modulators) and extend beyond the moving components of device. In some such implementations, the fluid barrier structures may extend substantially the entire distance between the substrates. In some other implementations, fluid barriers extend toward one another from both substrates.

FIGS. 15A-15C show example fluid barrier configurations for use in display apparatus. As depicted in FIGS. 15A-15C, a shutter assembly 1500 includes a MEMS device, such as a shutter 1502 that is supported by a plurality of anchors, such as the anchor 1504. Referring now specifically to FIG. 15A, a first discontinuous fluid barrier configuration including four fluid barrier structures 1510a-1510d are positioned at the corners of the shutter assembly 1500. Each of the fluid barrier structures extends towards adjacent fluid barrier structures. For example, as depicted in FIG. 15A, the fluid barrier structure 1510a extends towards the fluid barrier structure 1510b along one side of the shutter assembly 1500 and extends towards the fluid barrier structure 1510c along another side of the shutter assembly 1500. Similarly, fluid barrier structure 1510b extends towards the fluid barrier structure 1510a along the same side that the fluid barrier structure 1510a extends towards the fluid barrier structure 1510b. The two fluid barrier structures 1510a and 1510b are separated by an opening 1512a that is substantially smaller than the length of the fluid barrier structures 1510a and 1510b. Similarly, the fluid barriers 1510a-1510d are separated from adjacent fluid barriers 1510a-1510d by openings 1512a-1512d.

FIG. 15B shows a different discontinuous fluid barrier configuration, which includes four fluid barrier structures 1520a-1520d positioned to substantially surround two MEMS devices, such as the shutter assemblies 1500a and 1500b. Similar to the fluid barrier configuration depicted in FIG. 15A, each of the fluid barrier structures 1520a-1520d extends towards adjacent fluid barrier structures 1520a-1520d. For example, as depicted in FIG. 15B, the fluid barrier structure 1520a extends towards the fluid barrier structure 1520b along one side of the shutter assembly 1500a and extends towards the fluid barrier structure 1520c along another side of the shutter assembly 1500a. In contrast to the configuration depicted in FIG. 15A, the fluid barrier structures 1520a-1520d have a first side that is substantially equal to a corresponding side of the fluid barrier structure 1510a but a second side that is substantially twice the length of a corresponding side of the fluid barrier structure 1510a. This is because the fluid barriers 1520a-1520d are configured to substantially surround two shutter assemblies 1520a and 1520b. In some other implementations, a discontinuous fluid barrier configuration can be configured to surround more than two fluid barriers. The fluid barriers 1520a-1520d are separated from adjacent fluid barriers 1520a-1520d by openings 1512a-1512d.

FIG. 15C shows an example fluid barrier configuration for use in display apparatus. In this configuration, a plurality of discontinuous fluid barrier structures, such as the fluid barrier structure 1530 are separated from adjacent fluid barrier structures by openings, such as opening 1532. The region 1534a and 1534b may include any number of MEMS devices, such as shutter assemblies. Accordingly, the shutter assemblies 1500 depicted in FIGS. 15A and 1500a-1500b depicted in FIG. 15B may be positioned inside the region 1534a and 1534b. In some other implementations, more than two shutter assemblies can be positioned inside the regions 1534a and 1534b.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A display apparatus comprising:
   a first substrate;
   a plurality of microelectromechanical system (MEMS) light modulators formed from a structural material coupled to the first substrate;
   a second substrate separated from the first substrate; and
   a plurality of spacers extending from the first substrate, the spacers including:
      a first polymer layer of a plurality of polymer layers, the first polymer layer having a surface in contact with the first substrate;
      a second polymer layer of the plurality of polymer layers, the second polymer layer having a surface in contact with the first polymer layer; and
      a layer of the structural material in contact with all surfaces of each of the plurality of polymer layers not in contact with the first substrate or another of the plurality of polymer layers.

2. The display apparatus of claim 1, wherein the surface of the second polymer layer is in contact with all surfaces of the first polymer layer not in contact with the first substrate.

3. The display apparatus of claim 1, wherein the layer of the structural material is in contact with a portion of the surface of the first polymer layer.

4. The display apparatus of claim 1, wherein at least one of the plurality of spacers comprises an anchor for suspending at least one of the plurality of MEMS light modulators over the first substrate.

5. The display apparatus of claim 1, wherein at least one of the first polymer layer and the second polymer layer includes a resist layer.

6. The display apparatus of claim 1, wherein the layer of the structural material includes at least one of a semiconductor layer and a metal layer.

7. The display apparatus of claim 1, wherein the layer of the structural material comprises at least one of silicon (Si), aluminum (Al), aluminum oxide ($Al_2O_3$), titanium (Ti), silicon nitride (SiN), and an oxynitride (OxNy).

8. The display apparatus of claim 6, wherein the metal layer absorbs at least about 80% of light impinging on the layer of the structural material.

9. The display apparatus of claim 1, wherein the layer of the structural material is a plasma enhanced chemical vapor deposition (PECVD)-deposited layer.

10. The display apparatus of claim 1, wherein the plurality of spacers are sized to keep the second substrate at least a minimum distance away from the plurality of light modulators.

11. An apparatus comprising:
    a first substrate;
    at least one microelectromechanical system (MEMS) device formed from a structural material and coupled to the first substrate;
    a second substrate separated from the first substrate; and
    a plurality of spacers extending from the first substrate, the spacers including a first polymer layer and a second polymer layer of a plurality of polymer layers, and a plasma enhanced chemical vapor deposition (PECVD)-deposited layer of the structural material in contact with all surfaces of each of the plurality of polymer layers not in contact with the first substrate or another of the plurality of polymer layers.

12. The apparatus of claim 11, wherein the surface of the second polymer layer is in contact with all surfaces of the first polymer layer not in contact with the first substrate.

13. The apparatus of claim 11, wherein the layer of the structural material is in contact with a portion of the surface of the first polymer layer.

14. The apparatus of claim 11, wherein at least one of the first polymer layer and the second polymer layer includes a resist layer.

15. The apparatus of claim 11, wherein the layer of the structural material includes at least one of a semiconductor layer and a metal layer.

16. The apparatus of claim 11, wherein the layer of the structural material comprises at least one of silicon (Si), titanium (Ti), silicon nitride (SiN), and an oxynitride (OxNy).

17. The apparatus of claim 15, wherein the metal layer absorbs at least about 80% of light impinging on the layer of the structural material.

18. The apparatus of claim 11, wherein the plurality of spacers are sized to keep the second substrate at least a minimum distance away from the MEMS device.

19. A display apparatus comprising:
    a first substrate;
    at least one microelectromechanical system (MEMS) device formed from a light absorbing structural material and supported over the first substrate;

a second substrate separated from the first substrate; and
a plurality of spacers extending from the first substrate the spacers including:
 a first polymer layer of a plurality of polymer layers, the first polymer layer having a surface in contact with the first substrate;
 a second polymer layer of the plurality of polymer layers, the second polymer layer having a surface in contact with the first polymer layer; and
 a layer of the light absorbing structural material in contact with all surfaces of each of the plurality of polymer layers not in contact with the first substrate or another of the plurality of polymer layers, the layer of the light absorbing structural material absorbing at least 80% of light impinging on the light absorbent layer of the structural material.

20. The apparatus of claim 19, wherein at least one of the first polymer layer and the second polymer layer includes a resist layer.

21. The apparatus of claim 19, wherein the surface of the second polymer layer is in contact with all surfaces of the first polymer layer not in contact with the first substrate.

22. The apparatus of claim 19, wherein the light absorbent layer of the structural material comprises at least one silicon (Si), titanium (Ti), silicon nitride (SiN), and an oxynitride (OxNy).

23. The apparatus of claim 19, wherein the layer of the light absorbing structural material is a plasma enhanced chemical vapor deposition (PECVD)-deposited layer.

24. The apparatus of claim 19, wherein the plurality of spacers are sized to keep the second substrate at least a minimum distance away from the MEMS device.

25. An apparatus comprising:
a first substrate;
at least one microelectromechanical system (MEMS) device formed from a structural material and connected to the first substrate;
a second substrate separated from the first substrate; and
a plurality of spacers extending from the first substrate, the plurality of spacers including:
 a first polymer layer of a plurality of polymer layers, the first polymer layer having a surface in contact with the first substrate;
 a second polymer layer of the plurality of polymer layers, the second polymer layer having a surface in contact with the first polymer layer; and
 a plasma enhanced chemical vapor deposition (PECVD)-deposited layer of the structural material in contact with all surfaces of each of the plurality of polymer layers not in contact with the first substrate or another of the plurality of polymer layers.

26. The apparatus of claim 25, wherein the surface of the second polymer layer is in contact with all surfaces of the first polymer layer not in contact with the first substrate.

27. The apparatus of claim 25, wherein at least one of the first polymer layer and the second polymer layer includes a resist layer.

28. The apparatus of claim 25, wherein the layer of the structural material includes at least one of a semiconductor layer and a metal layer.

29. The apparatus of claim 25, wherein the layer of the structural material comprises at least one of silicon (Si), titanium (Ti), silicon nitride (SiN), and an oxynitride (OxNy).

30. The apparatus of claim 25, wherein the layer of structural material absorbs at least about 80% of light impinging on the layer of the structural material.

31. The apparatus of claim 25, wherein the plurality of spacers are sized to keep the second substrate at least a minimum distance away from the MEMS device.

32. A display apparatus comprising:
a first substrate;
a plurality of microelectromechanical system (MEMS) light modulators formed from a structural material coupled to the first substrate;
a second substrate separated from the first substrate; and
at least one anchor for suspending at least one of the plurality of MEMS light modulators over the first substrate, the anchor including:
 a first polymer layer of a plurality of polymer layers, the first polymer layer having a surface in contact with the first substrate;
 a second polymer layer of the plurality of polymer layers, the second polymer layer having a surface in contact with the first polymer layer; and
 a layer of the structural material in contact with all surfaces of each of the plurality of polymer layers not in contact with the first substrate or another of the plurality of polymer layers.

33. The display apparatus of claim 32, wherein the surface of the second polymer layer is in contact with all surfaces of the first polymer layer not in contact with the first substrate.

34. The display apparatus of claim 32, wherein at least one of the first polymer layer and the second polymer layer includes a resist layer.

35. The display apparatus of claim 32, wherein the layer of the structural material includes at least one of a semiconductor layer and a metal layer.

36. The display apparatus of claim 32, wherein the layer of the structural material comprises at least one of silicon (Si), aluminum (Al), aluminum oxide ($Al_2O_3$), titanium (Ti), silicon nitride (SiN), and an oxynitride (OxNy).

37. The display apparatus of claim 32, wherein the layer of the structural material absorbs at least about 80% of light impinging on the layer of the structural material.

38. The display apparatus of claim 32, wherein the layer of the structural material is a plasma enhanced chemical vapor deposition (PECVD)-deposited layer.

39. A display apparatus comprising:
a first substrate;
a plurality of microelectromechanical system (MEMS) light modulators formed from a structural material and suspended over the first substrate;
a second substrate separated from the first substrate; and
a fluid barrier substantially enclosing more than one but less than all of the MEMS light modulators, wherein:
 the fluid barrier includes a first polymer layer and a second polymer layer of a plurality of polymer layers, and a layer of the structural material in contact with all surfaces of each of the plurality of polymer layers not in contact with the first substrate or another of the plurality of polymer layers; and
 the fluid barrier extends from the first substrate and is configured for interfering with flow of fluid across the display towards the enclosed MEMS light modulators.

40. The display apparatus of claim 39, wherein the fluid barrier has a height over the first substrate substantially equivalent to a height of the plurality of MEMS light modulators over the first substrate.

41. The display apparatus of claim 39, wherein the fluid barrier comprising a plurality of discontinuous barrier structures separated by openings there between.

42. The apparatus of claim 39, wherein the surface of the second polymer layer is in contact with all surfaces of the first polymer layer not in contact with the first substrate.

43. The display apparatus of claim 39, wherein the layer of the structural material is in contact with a portion of the surface of the first polymer layer.

44. An apparatus comprising:
a first substrate;
a plurality of microelectromechanical system (MEMS) devices connected to the first substrate and formed from a structural material;
a second substrate separated from the first substrate; and
a fluid barrier comprising a plurality of spacers comprising a first polymer layer and a second polymer layer of a plurality of polymer layers, and a layer of the structural material in contact with all surfaces of each of the plurality of polymer layers not in contact with the first substrate or another of the plurality of polymer layers.

45. The apparatus of claim 44, wherein the plurality of spacers form a substantially continuous barrier around at least one MEMS device.

46. The apparatus of claim 44, wherein the plurality of spacers is configured to substantially enclose more than one MEMS device and less than all of the plurality of MEMS devices.

47. An apparatus comprising:
a first substrate;
a plurality of microelectromechanical system (MEMS) devices formed from a structural material and supported by the first substrate;
a second substrate separated from the first substrate; and
a fluid barrier comprising a plurality of spacers configured to substantially enclose more than one MEMS device and less than all of the plurality of MEMS devices, wherein the fluid barrier includes a first polymer layer and a second polymer layer of a plurality of polymer layers, and a layer of the structural material in contact with all surfaces of each of the plurality of polymer layers not in contact with the first substrate or another of the plurality of polymer layers.

48. The apparatus of claim 47, wherein the plurality of spacers form a substantially contiguous barrier around at least one MEMS device.

49. The apparatus of claim 47, wherein the layer of the structural material is in contact with a portion of the surface of the first polymer layer.

50. The apparatus of claim 49, wherein the surface of the second polymer layer is in contact with all surfaces of the first polymer layer not in contact with the first substrate.

\* \* \* \* \*